United States Patent [19]
Kakizaki et al.

[11] Patent Number: 5,894,056
[45] Date of Patent: *Apr. 13, 1999

[54] MASK SUBSTRATE, PROJECTION EXPOSURE APPARATUS EQUIPPED WITH THE MASK SUBSTRATE, AND A PATTERN FORMATION METHOD UTILIZING THE PROJECTION EXPOSURE APPARATUS

[75] Inventors: Yukio Kakizaki, Kanagawa-ken; Toru Kiuchi, Higashi-kurume-si; Kesayoshi Amano; Toshikazu Umatate, both of Tokyo, all of Japan

[73] Assignee: Nikon Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/734,544

[22] Filed: Oct. 21, 1996

[30] Foreign Application Priority Data

Dec. 19, 1995 [JP] Japan ................. 7-330542

[51] Int. Cl.$^6$ .................. G06F 9/00; G03B 27/42; G01B 11/00
[52] U.S. Cl. .................. 430/5; 430/22; 430/30; 356/399; 356/400; 356/401; 355/53; 355/67; 355/68; 355/74
[58] Field of Search .................. 430/5, 22, 30; 356/399, 400, 401; 355/53, 67, 68, 74

[56] References Cited

U.S. PATENT DOCUMENTS

| | | | |
|---|---|---|---|
| 4,558,949 | 12/1985 | Uehara et al. | 356/152 |
| 4,780,616 | 10/1988 | Nishi et al. | 250/548 |
| 4,924,257 | 5/1990 | Jain | 355/53 |
| 5,138,176 | 8/1992 | Nishi | 250/548 |
| 5,194,893 | 3/1993 | Nishi | 355/53 |
| 5,243,195 | 9/1993 | Nishi | 250/548 |
| 5,337,097 | 8/1994 | Suzuki et al. | 353/101 |
| 5,448,332 | 9/1995 | Sakakibara et al. | 355/53 |
| 5,464,715 | 11/1995 | Nishi et al. | 430/22 |
| 5,473,410 | 12/1995 | Nishi | 355/53 |
| 5,477,304 | 12/1995 | Nishi | 355/53 |

FOREIGN PATENT DOCUMENTS

| | | |
|---|---|---|
| 60-78454 | 5/1985 | Japan . |
| 62-150106 | 7/1987 | Japan . |
| 62-150721 | 7/1987 | Japan . |
| 62-229838 | 10/1987 | Japan . |
| 4-45512 | 2/1992 | Japan . |
| 5-21314 | 1/1993 | Japan . |
| 7-57986 | 3/1995 | Japan . |

*Primary Examiner*—Mark Chapman
*Attorney, Agent, or Firm*—Oliff & Berridge, PLC

[57] ABSTRACT

In order to reduce mask pattern transfer error caused by expansion of the mask substrate during transferring the circuit pattern onto the photosensitive substrate, a mask substrate is loosely supported on a plurality of mounts on the mask stage so that the mask substrate can freely expand in response to changes in its temperature. A measuring instrument (such as a temperature sensor or an interferometer) is used to measure a value representing the expansion amount of the mask substrate. Alignment and positioning of the mask substrate and the photosensitive substrate is adjusted in response to the expansion amount of the reticle, based on the measured value.

30 Claims, 12 Drawing Sheets

MASK SUBSTRATE, PROJECTION EXPOSURE APPARATUS EQUIPPED WITH THE MASK SUBSTRATE, AND A PATTERN FORMATION METHOD UTILIZING THE PROJECTION EXPOSURE APPARATUS

BACKGROUND OF THE INVENTION

1. Field of the Invention

The invention relates to a mask substrate used in a lithographic process for manufacturing, e.g., semiconductor devices or liquid crystal display devices, and to a projection exposure apparatus that transfers a circuit pattern onto a photosensitive substrate, such as, e.g., a semiconductor wafer or a glass plate, from a mask substrate. The invention also relates to a method of forming a circuit pattern onto a photosensitive substrate using a projection exposure apparatus.

2. Description of Related Art

In manufacturing semiconductor devices (e.g., VLSI) or liquid crystal devices, it is indispensable to perform a lithographic process for exposing and transferring a circuit pattern onto a photosensitive substrate, such as a photoresist-coated semiconductor wafer or glass plate. The lithographic process uses a projection exposure apparatus to project and expose a circuit pattern image formed on a mask substrate (also referred to as a reticle) onto a photosensitive substrate through a projection optical system having a magnification equal to or less than 1. This projection exposure apparatus is called a stepper, because it operates in a step-and-repeat manner to repeat an action of driving a two-dimensional driving stage supporting a photosensitive substrate by a predetermined amount to a next shot area for exposure, every time exposure of the projection image of the reticle circuit pattern onto a shot area on the photosensitive substrate has been accomplished.

In order to simultaneously achieve high resolution and a broader exposure field, a step-and-scan type projection exposure apparatus has recently been proposed. In this technique, the reticle and the photosensitive substrate are scanned one-dimensionally relative to the field of view of the projection optical system during exposure of one shot. When exposure is not performed, the photosensitive substrate is driven in a stepwise manner. See, e.g., "Optical/Laser Microlithography II", SPIE Vol. 1088, at 424–433 (1989). Also see, e.g., U.S. Pat. No. 5,477,304 and U.S. Pat. No. 4,924,257, both of which are incorporated herein by reference in their entireties.

The reticle is fixed to and supported on the reticle stage in the apparatus by applying a vacuum thereto, so that the main surface of the reticle, on which the circuit pattern is formed, is precisely aligned with the object surface of the projection optical system. By illuminating the pattern area (normally, a rectangular area of illumination is used, although, as disclosed in the above-incorporated patents, the illumination area also can be arcuate or hexagonal, for example) of the reticle mounted on the stage with exposure illumination light, the pattern image formed on the pattern area is projected through the projection optical system and onto the photosensitive substrate.

Generally, the reticle is formed by etching a light-blocking material (e.g., chromium) layer formed on the main surface of a quartz plate by evaporation into the circuit pattern. Alternatively, a certain type of phase shift reticle is formed by etching a transmissive material shifter layer formed on the main surface of the quartz plate into the circuit pattern.

The size of the reticle has increased from 4 inches, to 5 inches, and currently to 6 inches as a standard, as integration techniques have improved and as the device (i.e., the chip) size has increased. In an exposure apparatus for producing liquid crystal devices in which the circuit pattern is exposed by a scanning scheme using a projection optical system with a magnification of 1, the mask and the photosensitive substrate (glass plate) are the same in size, and a mask larger than 40×40 cm may be used.

In the manufacturing site of semiconductor devices, mass production of 64M D-RAM has started. Moreover, although still in the trial stage of manufacturing, a great deal of study and development for mass production of 256M D-RAM and 1 G D-RAM has been made. It is expected that mass production of both 256M (Megabyte) memory and 1 G (Gigabyte) memory devices will require a projection exposure apparatus that uses an ultraviolet light source.

On the other hand, the accuracy standard has become more and more strict in various functions for manufacturing such devices required in the projection exposure apparatus. In particular, very strict precision in image formation of the projection optical system and alignment accuracy between the reticle and the photosensitive substrate (wafer) are required. For this reason, a design and manufacturing method for approaching an ideal image formation capacity of the projection optical system has been desired. Developing various types of sensors is also desired to improve the alignment precision.

However, even though efficiency and performance are improved in the projection exposure apparatus, a problem of heat energy accumulation still remains, which is caused by continuously illuminating the reticle with illumination light. The extent of heat accumulation varies depending on the material used to make the circuit pattern formed on the reticle and the light transmittance through the reticle. If the circuit pattern is formed with a non-transmissive material layer, and if the ratio of the total light-blocking portion to the overall illuminated area is greater, heat accumulation becomes great.

Due to such heat accumulation, the temperature of the reticle rises, and as a result, the reticle slightly expands. Since the four corners of the reticle are fixed to the reticle stage at the vacuum mounting positions, the reticle is physically warped by the heat expansion. This adversely affects the flatness of the reticle. If the flatness of the reticle is degraded, the projected pattern image will contain errors, such as distortion aberration, image surface distortion, or image surface tilting, even if the imaging property of the projection optical system is close to ideal. This error adversely affects the final image of the circuit pattern to be transferred onto the photosensitive substrate.

In particular, a problem arises from the fact that heat accumulation and heat release of the reticle slightly varies depending on the change in the exposure sequence of the photosensitive substrate and the illumination conditions. More seriously, a reticle may be replaced with another reticle having a completely different circuit pattern, and tendencies of heat accumulation and heat release are different for each reticle. Thus, although the same projection exposure apparatus is used, the quality of the image to be transferred onto the photosensitive substrate changes depending on the circuit pattern.

Even in a single reticle, the influence of heat accumulation is totally different, for example, between a situation where the reticle has just been mounted on the exposure apparatus, and a situation where exposure operation has been continuously performed. Consequently, the quality of the transferred pattern image deteriorates gradually.

SUMMARY OF THE INVENTION

Therefore, it is an object of embodiments of the present invention to reduce the deterioration of the projected image due to a slight expansion of the reticle (mask substrate) that occurs in a projection exposure apparatus.

It is also an object of embodiments of the invention to provide a projection exposure apparatus that is capable of accurately correcting an alignment error and a superposing error, caused by minute positional shifts of the reticle itself on the reticle stage in addition to a slight expansion of the reticle.

It is a further object of embodiments of the invention to provide an improved mask substrate suitable for the projection exposure apparatus.

It is another object of embodiments of the invention to provide a method for forming a circuit pattern while preventing the transferred image (e.g., the entire rectangular pattern area) of the mask substrate circuit pattern onto the photosensitive substrate from slightly changing in size due to expansion of the mask substrate.

One aspect of the invention relates to a mask substrate comprised of a transparent parallel plate (e.g., a quartz plate) having a given thickness. A circuit pattern, which is to be transferred onto the photosensitive substrate, is formed, e.g., from a light-blocking material layer or a phase-shifter material layer on one of the main surfaces of the transparent parallel plate. The periphery of the transparent parallel plate is defined by, e.g., four side surfaces. Reflective areas are formed on at least a portion of the side surfaces of the transparent parallel plate with a reflective material (e.g., metal, such as chromium and aluminum, or a dielectric film) having a given reflectance to a light beam. The reflective areas on the side surfaces are used as reference positions when the circuit pattern is formed on the main surface of the parallel plate. In other words, the circuit pattern is printed on the mask substrate with precise positioning using the reflective portions of the side surfaces as reference marks. Accordingly, by monitoring the positions of the reflective surfaces when the reticle is mounted on the projection exposure apparatus, the position of the reticle pattern can be precisely known.

A second aspect of the invention relates to a projection exposure apparatus that is comprised of an illumination system for illuminating a mask substrate having a circuit pattern thereon with exposure illumination light, a projection optical system for projecting the circuit pattern image of the mask substrate onto a photosensitive substrate by means of illumination with the illumination light, and a two-dimensional driving stage for supporting the photosensitive substrate and two-dimensionally moving the photosensitive substrate relative to the field of view of the projection optical system. The mask substrate, on which the circuit pattern is formed, is supported so that the main surface of the mask substrate is aligned with the object plane of the projection optical system. To achieve this alignment, the projection exposure apparatus includes a mask stage, a column structure, a plurality of interferometers and a driving mechanism. The mask stage includes a plurality of mounts for contacting the periphery of the mask substrate at a plurality of positions to support the mask substrate while allowing free expansion of the mask substrate on the mounts along the main surface. The column structure supports the mask stage so that the mask stage moves within a plane substantially parallel to the main surface of the mask substrate. The plurality of interferometers measure positional shift information of the reflective areas formed on at least a portion of the side surfaces of the mask substrate by emitting measuring beams to the reflective areas and by receiving the beams reflected by the reflective areas. The driving mechanism moves the mask stage relative to the column structure (or moves the mask relative to the mask stage) based on the information measured by the interferometers.

A third aspect of the invention also relates to the projection exposure apparatus. In order to support the mask substrate having the circuit pattern thereon so that the main surface of the mask substrate is aligned with the object plane of the projection optical system, the projection exposure apparatus comprises a mask stage having a plurality of mounts for contact with the periphery of the mask substrate at a plurality of positions to support the mask substrate while allowing minute movement along the main surface on the mounts. The column structure integrally supports the mask stage with regard to the projection optical system. The plurality of interferometers measure positional shift information of the reflective areas formed on at least a portion of the side surfaces of the mask substrate by emitting measuring beams to the reflective areas and by receiving the beams reflected from the reflective areas. The driving mechanism slightly moves the mask substrate on the mask stage based on the information measured by the interferometers.

A fourth aspect of the invention relates to a method for forming a circuit pattern on a photosensitive substrate by repeating exposure operations in which illumination light is illuminated on a pattern area formed on a mask substrate to successively expose a pattern image in the pattern area onto each of a plurality of shot areas on the photosensitive substrate through a projection optical system. The mask substrate is positioned on the object plane side of the projection optical system so as to allow free expansion of the mask substrate. An expansion amount of the mask substrate relative to an initial state is detected, the expansion being caused by heating of the mask substrate during the repeating exposure operations using the mask substrate. This can be accomplished, e.g., by measuring with a temperature sensor or an interferometer system based on the side surfaces of the mask substrate. Then, an image formation characteristic of the projection optical system is adjusted in response to the detected expansion amount to correct slight changes caused by the expansion of the mask substrate in the state of the pattern image to be exposed onto the shot areas of the photosensitive substrate. This can be accomplished, e.g., by moving a portion of the optical lens group forming the projection optical system, adjusting the gas pressure of an air interval between lenses, etc.

BRIEF DESCRIPTION OF THE DRAWINGS

The invention will be described in conjunction with the following drawings in which like reference numerals designate like elements and wherein.

DETAILED DESCRIPTION OF PREFERRED EMBODIMENTS

In accordance with the invention, a reflective area is formed on at least a portion of the side surfaces of a mask substrate (otherwise known as a reticle) R. A measuring beam is emitted from an interferometer to the reflective area to measure the positional shift of the mask substrate. At the same time, the mask substrate is supported on the mask stage by vacuum so as to allow for the free expansion of the mask substrate without being rigidly fixed thereto. Due to this structure, distortion of the projected image due to slight expansion of the mask substrate is greatly reduced, while the accurate monitoring of the positional shift of the circuit pattern image caused by the slight expansion of the mask substrate is permitted.

Because the position of the side surface of the mask substrate is directly measured by the interferometer, and because the mask substrate is driven based on the measured value, moving mirrors fixed to the mask stage and used in the conventional system for monitoring the position of the mask stage, can be omitted. In the conventional system, in spite of the fact that the position of the mask substrate supported on the mask stage is slightly changed by vibrations acting on the exposure device, the positional change was not clearly measured, which worsened the alignment error and superposition error arising during exposure.

On the contrary, in the present invention, the mask substrate is supported on the mask stage by a soft friction or soft pushing force applied perpendicularly to the stage. Basically, the positional shift of the mask substrate on the mask stage does not become a main cause of the alignment error and superposition error, because the positional shift is directly detected by the interferometers as a shift measurement. The quality of the projected image is not adversely affected even if the mask substrate slightly expands and slightly slips out of position. This can be realized in mass production of microscopic devices with a line interval less than 0.25 μm, such as 256M memories or 1 G memories, with a high accuracy and yield rate.

Figure 1:
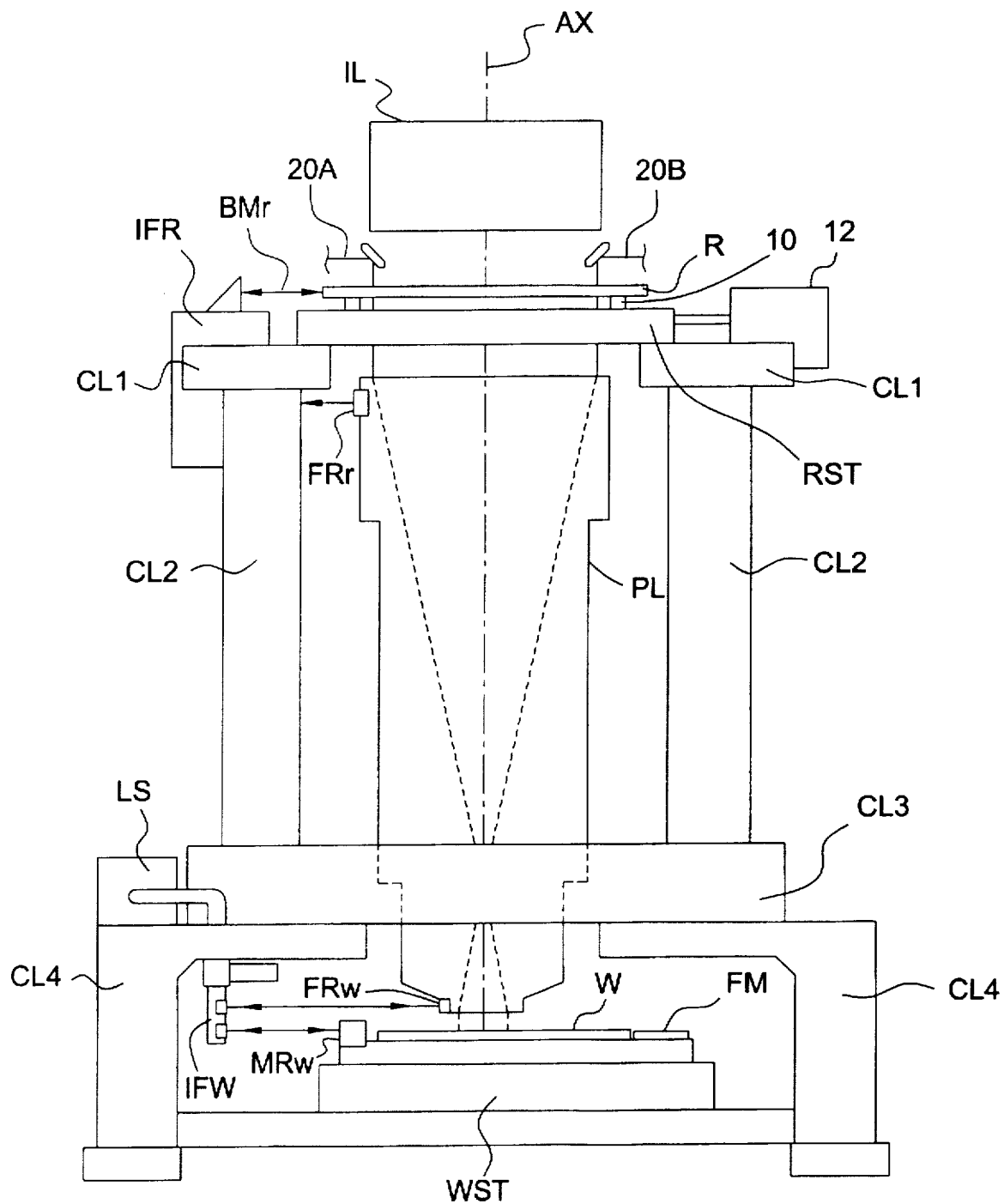
FIG. 1 is a schematic diagram showing the overall structure of the projection exposure apparatus in accordance with a first preferred embodiment of the invention.

The structure of the projection exposure apparatus of a first embodiment of the invention will be described, making reference to FIGS. 1, 2 and 3. FIG. 1 schematically shows the overall structure of a step-and-repeat type projection exposure apparatus. The illumination optics (IL) emits exposure illumination light to illuminate the circuit pattern area of the reticle R with uniform intensity distribution. The reticle R is mounted on the reticle stage RST through four mounts 10 that project at four positions on the reticle stage RST. Among the four mounts 10, one or two of these mounts 10 support the reticle R by applying a vacuum thereto.

Alignment system 20A and 20B photoelectrically detect the alignment marks provided at two points on the periphery of the reticle R, thereby positioning the reticle R with regard to the optical axis AX of the illumination optics IL and the projection optical system PL with a predetermined precision. The positioning is carried out by a driving system 12 that translates the reticle stage RST within the X-Y plane, which is perpendicular to the optical axis AX, while slightly rotating the reticle stage RST within the X-Y plane.

The reticle stage RST is movably supported on the reticle stage base structure CL1, which constitutes a part of the column structure of the apparatus body. The driving system 12, including its motor, is also mounted on the base structure CL1. The beam interference elements (i.e., the beam splitter, etc.) of the reticle interferometer system IFR, which is one feature of the invention, is also fixed onto the reticle base structure CL1. The interferometer system IFR emits measuring beam BMr perpendicularly to the reflective area formed on a portion of the side surface of the reticle R, and receives the reflected beam to detect the positional shift of the reticle R.

The circuit pattern image of the reticle R is projected and focused onto the wafer W, which is a photosensitive substrate, with a magnification of, e.g., ¼ or ⅕, through the projection optical system PL positioned directly under the reticle stage RST. The lens barrel of the projection optical system PL is fixed to the lens base structure CL3, which constitutes a part of the column structure. The lens base structure CL3 supports the reticle base structure CL1 through a plurality of columns CL2.

The reticle interferometer system IFR shown in FIG. 1 is designed so that the reflected beam of the measuring beams BMr interferes with the reference beam reflected from the reference mirror FRr fixed above the projection optical system PL. However, as alternatives, the reference mirror may be fixed to the reticle base structure CL1, or may be built into the interferometer system.

The lens base structure CL3 is mounted on the wafer base structure CL4. The wafer base structure CL4 houses the wafer stage WST, which supports the wafer W and two-dimensionally moves along the X-Y plane. The wafer stage WST is equipped with a wafer holder that holds the wafer W by applying a vacuum thereto so that the surface of the wafer W is in alignment with the image formation plane of the projection optical system PL. Wafer stage WST also is equipped with a leveling table for slightly moving the wafer holder in the Z direction (i.e., along the optical axis AX) while slightly slanting the wafer holder.

The coordinate position and a slight rotation amount generated by yawing of the wafer stage WST within the X-Y plane are measured by the wafer interferometer system IFW. The wafer interferometer system IFW detects the coordinate position and the rotation amount (yawing amount) of the wafer stage WST by emitting a laser beam from a laser light source LS to the moving mirror MRw attached to the leveling table of the wafer stage WST and to the fixed mirror FRw fixed to the lowermost position of the projection optical system PL, and by having the two reflected beams from the respective mirrors MRw and FRw, respectively, interfere with each other.

A reference plate FM is also mounted on the leveling table of the wafer stage WST. The reference plate FM is used for calibration and base line measurement (i.e., measurement of the positional relationship between the projection point of the center of the reticle pattern and the detection center of each of the alignment systems) of various alignment systems, focus sensors and leveling sensors. On the surface of the reference plate FM, a reference mark is formed, which is detectable together with a reference mark on the reticle R by the alignment systems 20A and 20B under illumination light having an exposure wavelength.

The base line measurement using a reference plate FM is disclosed in, for example, Japanese Laid-Open Patent Application No. 4-45512 and Japanese Laid-Open Patent Application No. 5-21314, the disclosures of which are incorporated herein by reference in their entireties. A focus calibration method using a reference plate FM is disclosed in, for example, these Laid-Open Japanese Patent publications. Therefore, a detailed explanation thereof will be omitted here.

Figure 2:
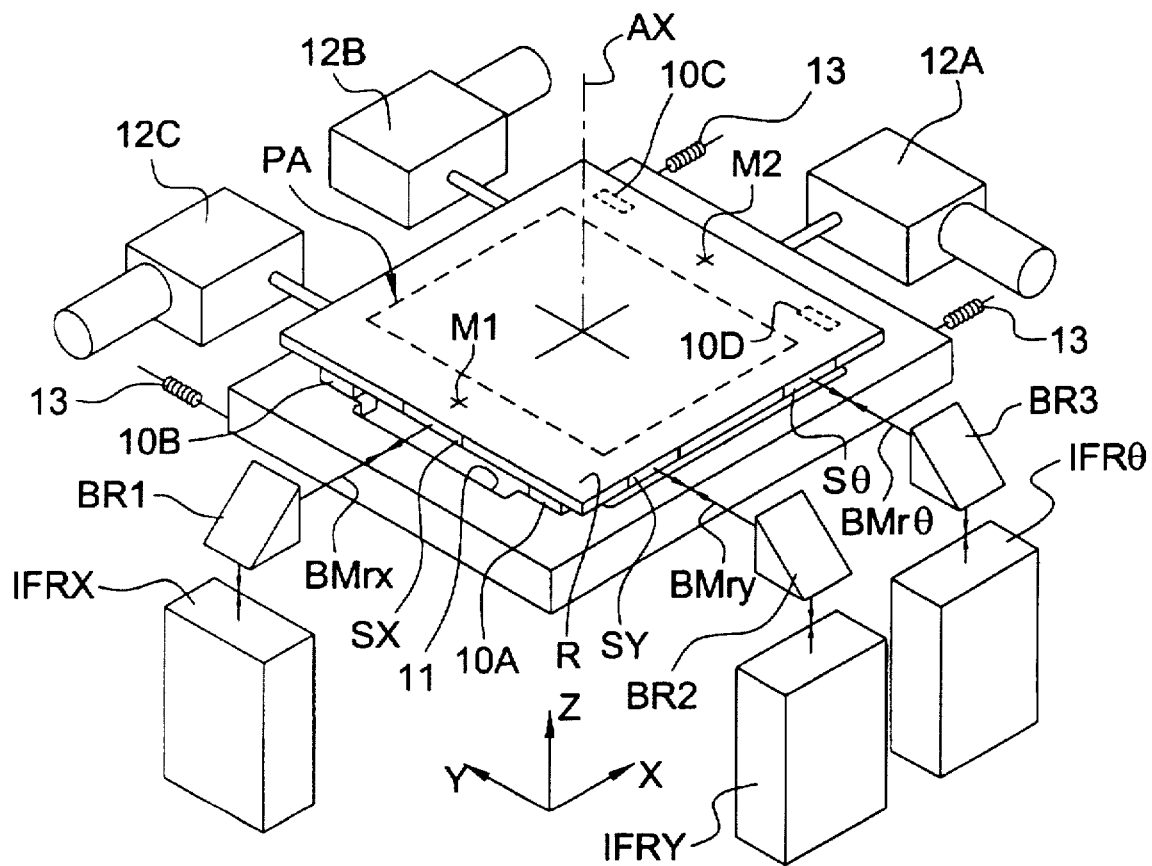
FIG. 2 is a perspective view showing the positional structure of the reticle stage and the interferometer system according to the first embodiment of the invention.

FIG. 2 is a perspective view of the reticle stage RST of FIG. 1 and the surrounding elements. In this figure, the reticle R is correctly positioned with respect to the optical axis AX of the projection optical system PL. An opening 11 is formed in the center of the reticle stage RST so as not to block the projected light paths through the rectangular pattern area PA formed on the reticle R and the two reference marks M1, M2 formed on either side of the pattern area PA in the X-axis direction. Mounts 10A, 10B, 10C and 10D are formed on the reticle stage RST around the opening 11 at four positions so as to have a predetermined height (10C and 10D are not seen in FIG. 2 because they are located behind the reticle R). These mounts support the reticle R on its rear side (i.e., the main surface on which the pattern is formed) at four corners thereof.

The driving system 12 for the reticle stage RST includes three driving units 12A, 12B and 12C. The driving unit 12A slightly drives the reticle stage RST in the X direction. The other two driving units 12B and 12C cooperate to slightly drive the reticle stage RST in the Y direction while slightly rotating it. The driving units 12A, 12B and 12C can be, e.g., actuators that linearly push the corresponding positions on the reticle R. Springs 13 are provided at several positions between the reticle stage RST and the reticle base column CL1 to force the reticle stage RST toward the direction of the actuators.

As shown in FIG. 2, reflective areas SX, SY and Sθ, which receive measuring beams from the reticle interferometer system, are formed on two orthogonal side surfaces of the reticle R. The reflective areas SX, SY and Sθ are formed by forming a reflective material layer, such as an aluminum layer, or a dielectric film having a high reflectance to the wavelength of the measuring beams, by evaporation after grinding the side surfaces of the reticle R. Although, in FIG. 2, the reflective areas SX, SY and Sθ are provided on a portion of the side surfaces of the reticle R, the entire area of a side surface extending in the X direction and the entire area of a side surface extending in the Y direction may be reflective.

The reticle interferometer system IFR includes an X-direction interferometer IFRX including a reflective mirror BR1 for reflecting the measuring beam BMrx in the X direction toward the reflective area SX, a Y-direction interferometer IFRY including a reflective mirror BR2 for reflecting the measuring beam BMry in the Y direction toward the reflective area SY, and a Y-direction interferometer IFRθ including a reflective mirror BR3 for reflecting the measuring beam BMrθ in the Y direction toward the reflective area Sθ.

The measuring beam BMrx reaching the reflective area SX is projected so as to be perpendicular to the optical axis AX of the projection optical system PL, while the measuring beams BMry and BMrθ reaching the reflective areas SY and Sθ, respectively, are emitted so as to be parallel to each other with a predetermined distance LK between them in the X direction. The positional shift of the reticle R in the X direction is detected by the measurement value of the interferometer IFRX, and the positional shift in the Y direction is detected by calculating the average of the measurement values of the interferometers IFRY and IFRθ. The positional shift in the rotational (θ) direction of the reticle R is detected by calculating the difference between the measurement values of the interferometers IFRY and IFRθ.

The measuring resolution of the interferometers IFRX, IFRY and IFRθ is selected so that the expansion amount of the reticle R, which is defined by the linear expansion coefficient of the reticle R, the expected temperature changing range, and the size (e.g., 6 inches) of the reticle R, can be detected. The profiles of the measuring beams BMrx, BMry and BMrθ at the side surfaces of the reticle R are shaped in an ellipse flattened along the side surface, or in a slit-like shape. The profiles of each of the reference beams emitted toward the reference mirrors FRr fixed at the top of the projection optical system PL are also shaped in an ellipse flattened in the same direction as the measuring beams, or in a slit-like shape.

The reason why the profile of the measuring beams and of the reference beams are shaped in an ellipse or slit is to prevent deviation from the interference state, which is caused by the fact that the advancing direction of the measuring beam reflected from the reticle side surface is slightly deflected by the slight rotation of the reticle R within the X-Y plane, within the rotation range where the reticle R is present.

Figure 3:
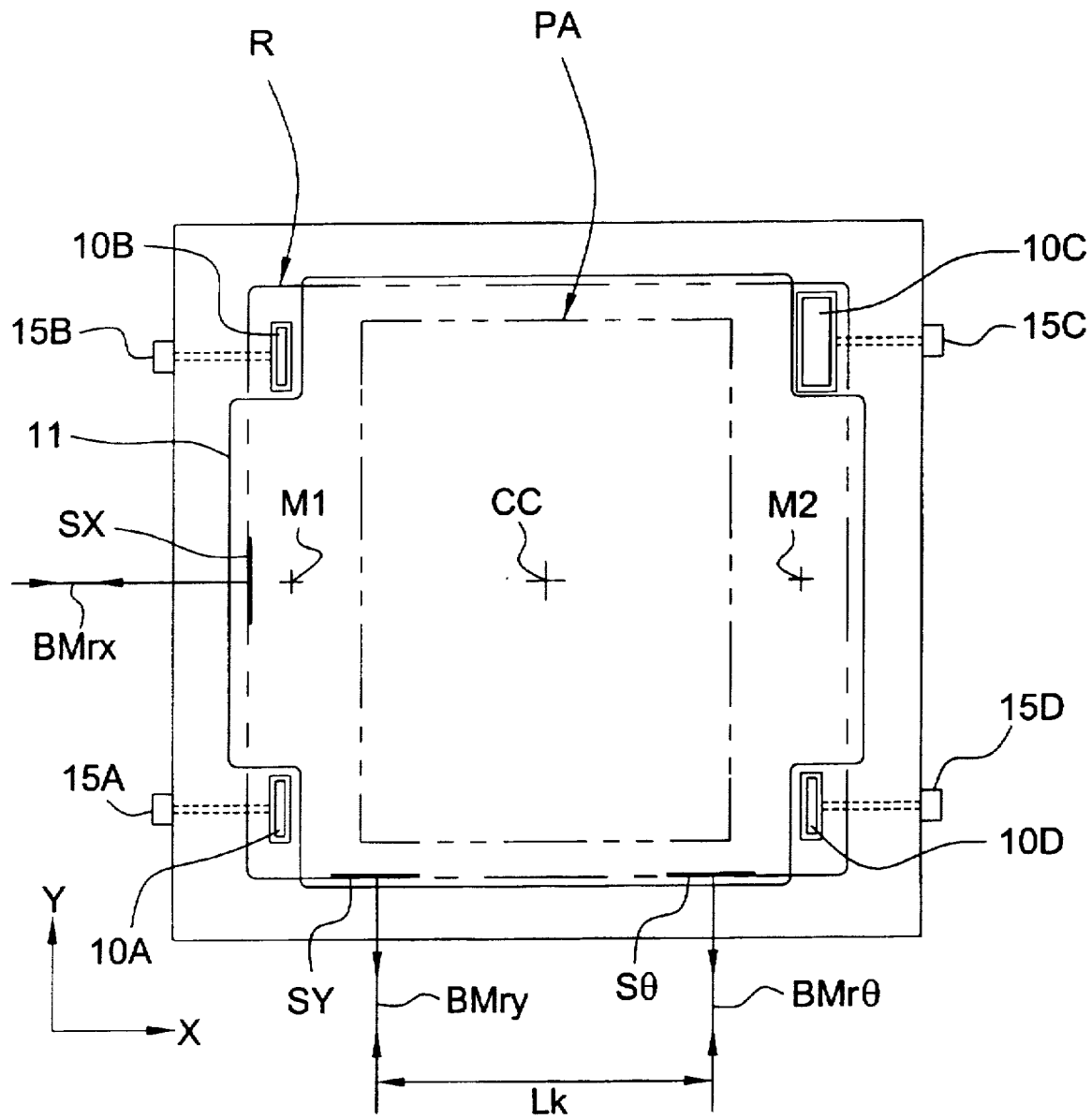
FIG. 3 is a plan view of the reticle stage of FIG. 2.

FIG. 3 is a plan view of the reticle stage RST shown in FIG. 2. The mounts 10A, 10B, 10C and 10D for supporting the reticle R are provided at four corners around the opening 11, which is formed so as not to block the projected light path through the pattern area PA and the marks M1 and M2. The adsorption (contact) surface of the mount 10C, which is located farthest from either of the reflective areas SX, SY and Sθ illuminated by the measuring beams BMrx, BMry and BMrθ of the reticle interferometer system, is formed larger than the adsorption surfaces of the other three mounts 10A, 10B and 10D, to increase the vacuum adsorption thereof.

Ports 15A, 15B, 15C and 15D are provided at the periphery of the reticle stage RST and function to connect the adsorption surfaces of the mounts 10A, 10B, 10C and 10D to a vacuum source. By applying a predetermined vacuum power to each of the ports 15A through 15D, the four corners of the reticle R can be rigidly adsorbed to (held in contact with) the reticle stage RST. However, in the preferred embodiment, only the mount 10C strongly adsorbs the reticle R, while releasing the vacuum adsorption to the other mounts to allow the reticle R to be supported by its own weight, at least during the successive exposure of a plurality of wafers W.

Supporting the reticle R only at the mount 10C by vacuum adsorption allows the reticle R to freely expand along the direction of the reflective areas SX, SY and Sθ formed on the two orthogonal side surfaces, with the mount 10C being used as a base point, as the temperature changes. This structure can prevent stress from being generated in the reticle R as the reticle R expands, and allows substantially linear expansion along the X-Y plane. In response to the amount of free expansion of the reticle R, the positions of the reflective areas SX, SY, Sθ slightly change along the X and Y directions. The amounts of the positional shift of the respective reflective areas caused from the free expansion are measured by the reticle interferometers IFRX, IFRY, and IFRθ with measuring beams BMrx, BMry, and BMrθ, respectively.

There may be a situation where the reticle R itself is slightly displaced from the reticle stage RST in spite of the strong adsorption of the mount 10C. If this is the case, the reticle interferometers IFRX, IFRY and IFRθ will output the measurement values containing both the positional shift of the reticle R itself and the heat expansion. Therefore, calculating positional shift (in the X and Y directions) and rotational displacement of the center point CC of the reticle R from the initial state based on only the measurement values from the reticle interferometers IFRX, IFRY and IFRθ cannot precisely determine whether the positional shift and the rotational displacement are caused by expansion of the reticle R or by the shifting of the reticle R itself, or by both factors.

Accordingly, because accurate information is lacking about the amount of positional shift and rotational displacement calculated from only the measurement values of the reticle interferometers, it is not reliable for performing feedback control of the driving units 12A, 12B and 12C for the reticle stage RST without additional information.

To overcome this problem, a temperature sensor system is provided for the projection exposure apparatus. The temperature sensor system detects the temperature of the reticle R with high accuracy and can be used to accurately specify the linear and rotational displacement of the center point CC of the reticle R from the initial position. When thermoelectric couple-type sensors are used in the temperature sensor system, a mechanism is provided for bringing the sensors into contact with several positions of the reticle R except for the pattern area PA and the mark areas M1, M2. When a non-contact type temperature sensor (e.g., an IR-CCD camera, etc.) is used, an optical system is provided for detecting the temperature change (and temperature distribution) of the entire surface of the reticle R through a condenser lens system within the illumination optics IL (of FIG. 1).

Based on the linear expansion coefficient of the transparent plate (e.g., the quartz plate) of the reticle R, which is determined in advance, the measured temperature change from the reference temperature (e.g., a predetermined temperature for manufacturing the reticle R), and the distance (positional relationship) between the support point (mount 10C) on the reticle R and each of the reflective areas SX, SY and Sθ, the positional shift amount Δmx, Δmy and Δmθ of the reflective areas SX, SY and Sθ due to the expansion component of the reticle R is estimated first. Based on the results of this estimation, the positional displacement of the center point CC (ΔXt, ΔYt), and the rotational displacement of the reticle (ΔRt) due to expansion, are determined.

Then, the positional change amount ΔFx, ΔFy and ΔFθ from the initial position of the reflective areas SX, SY and Sθ, which was actually measured by the reticle interferometers IFRX, IFRY and IFRθ, are read out to calculate deviation values ΔMx, ΔMy and ΔMθ from the estimated positional shift amount Δmx, Δmy and Δmθ as follows:

ΔMx=ΔFx−Δmx (X-direction component)

ΔMy=ΔFy−Δmy (Y-direction component)

ΔMθ=ΔFθ−Δmθ (Y-direction component)

If the deviations ΔMx, ΔMy and ΔMθ are within an acceptable range and are close to zero (0), it is known that the reticle R itself has not slipped out of position on the reticle stage RST. Therefore, the driving units 12A, 12B and 12C are feedback controlled so as to correct only the estimated linear displacement amount (ΔXt, ΔYt) and rotational displacement (ΔRt) due to the reticle expansion.

If the deviations ΔMx, ΔMy and ΔMθ are out of the acceptable range, it is regarded that the deviations are caused by the positional shifting of the reticle R itself. In this case, based on the deviations ΔMx, ΔMy and ΔMθ, the displacement amount (ΔXs, ΔYs) and the rotational displacement (ΔRs) of the center point CC, due to the positional shift of the reticle R, are calculated as follows:

ΔXs=ΔMx

ΔYs=(ΔMy+ΔMθ)/2

ΔRs=(ΔMy−ΔMθ)/Lk, where Lk is a distance along the X direction between the measuring beams BMry and BMrθ from the reticle interferometers (shown in FIG. 3). The estimated displacement (ΔXt, ΔYt) and rotational displacement (ΔRt) due to expansion are added to the linear displacement (ΔXs, ΔYs) and rotational displacement (ΔRs) due to the positional shift of the reticle R to obtain the final linear displacement (ΔXs+ΔXt, ΔYs+ΔYt) and rotational displacement (ΔRs+ΔRt) of the center point CC of the reticle R. The driving units 12A, 12B and 12C are feedback controlled based on the measurement values of the interferometers IFRX, IFRY and IFRθ so as to correct the linear displacement of the center point CC and the rotational displacement.

Figure 4:
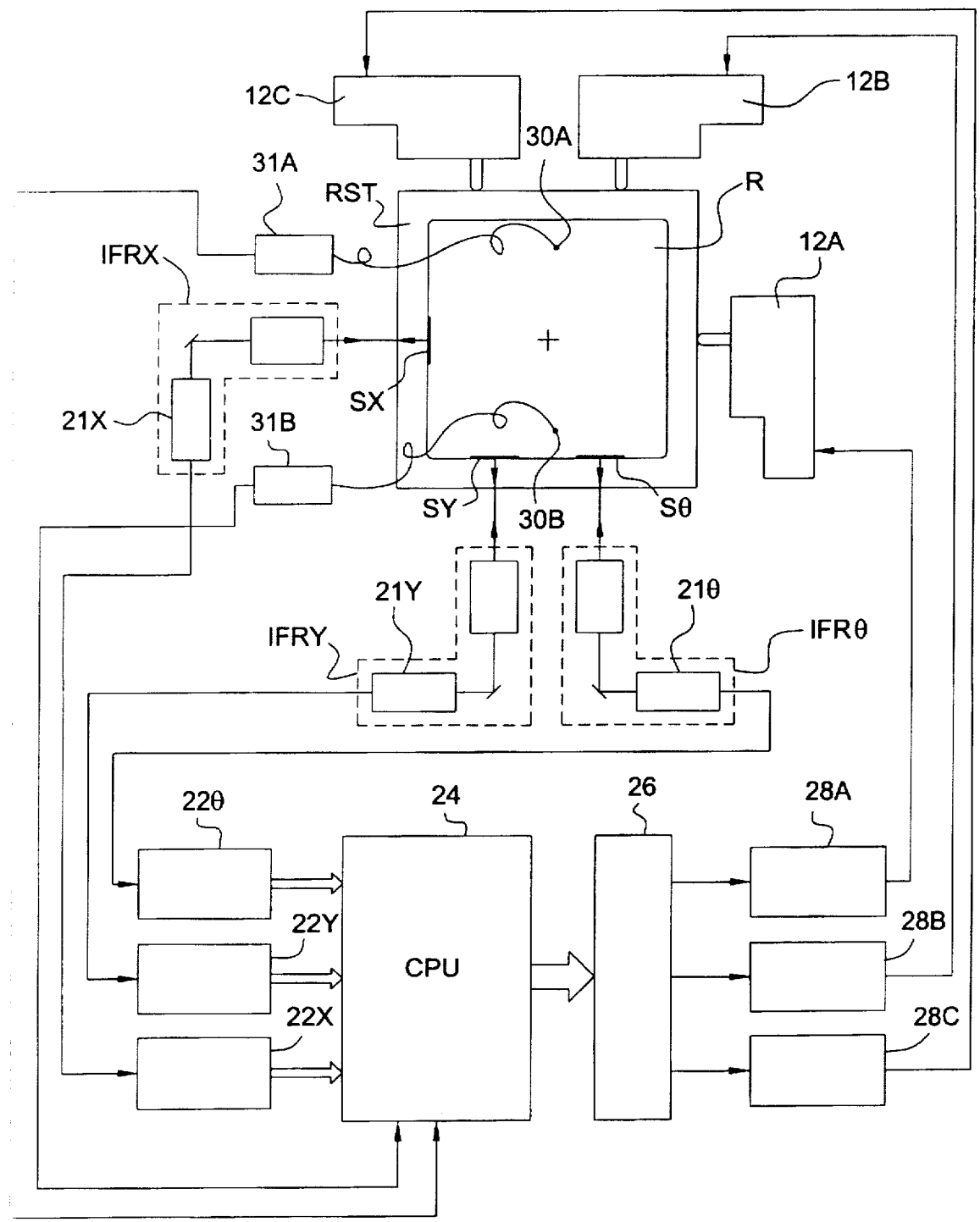
FIG. 4 is a block diagram showing the structure of the reticle stage control system according to the first embodiment of the invention.

FIG. 4 is a schematic block diagram showing the structure of the control system for performing the calculation and control operations described above. The reticle interferometers IFRX, IFRY and IFRθ include receivers 21X, 21Y and 21θ, respectively, for photoelectrically detecting interference beams between the reflected measuring beams from the reflective areas SX, SY and Sθ, respectively, and the reflected reference beams from the reference mirrors.

The signals from the receivers 21X, 21Y and 21θ are input to the counter circuit units 22X, 22Y and 22θ, respectively, which output digital values corresponding to the position of the measuring direction and positional change of the reflective areas SX, SY and Sθ in real time. The digital values are input to the CPU 24, which then calculates positional errors, such as linear displacement and rotational displacement, of the center point CC of the reticle R, and outputs control information for correcting the errors to the interface circuit 26. The interface circuit 26 outputs an optimum control command value to each of the servo circuits 28A, 28B and 28C, which drive the motors of the three driving units 12A, 12B and 12C, respectively.

The control system in FIG. 4 also includes temperature sensors 30A and 30B that detect temperature change at a plurality of points on the reticle R in a non-contact manner. The signals from the temperature sensors 30A and 30B are converted to digital values by the temperature measuring circuits 31A and 31B, respectively, and the digital outputs are input to the CPU 24. Based on the temperature information, the CPU 24 reads out the expansion coefficient of the reticle R and data indicative of the positional relationship among the reflective areas SX, SY and Sθ on the reticle R, which are stored in the memory in advance, to estimate the positional shift amounts Δmx, Δmy and Δmθ of the reflective areas SX, SY and Sθ, respectively, due to the expansion of the reticle R in the measuring direction.

In this embodiment, vacuum adsorption is applied only to the mount 10C to adsorb and fix the reticle R to the reticle stage RST. However, the invention is not limited to this structure. Soft vacuum adsorption may also be applied to the other three mounts 10A, 10B and 10D as long as it does not prevent the free expansion of the reticle R. Alternatively, soft vacuum adsorption may be uniformly applied to all four of the mounts 10A, 10B, 10C and 10D in a range that does not prevent free expansion of the reticle R.

Since the reticle stage RST fixedly adsorbs the reticle R through the mount 10C at one corner, or loosely supports the reticle R through the four mounts with soft vacuum adsorption, the reticle R can freely expand in the X-Y plane direction in response to the temperature change without generating undesirable stress. This prevents deformation of the pattern surface of the reticle R, and therefore, prevents the projected image from being gradually deteriorated during the continuous exposure process.

Figure 5:
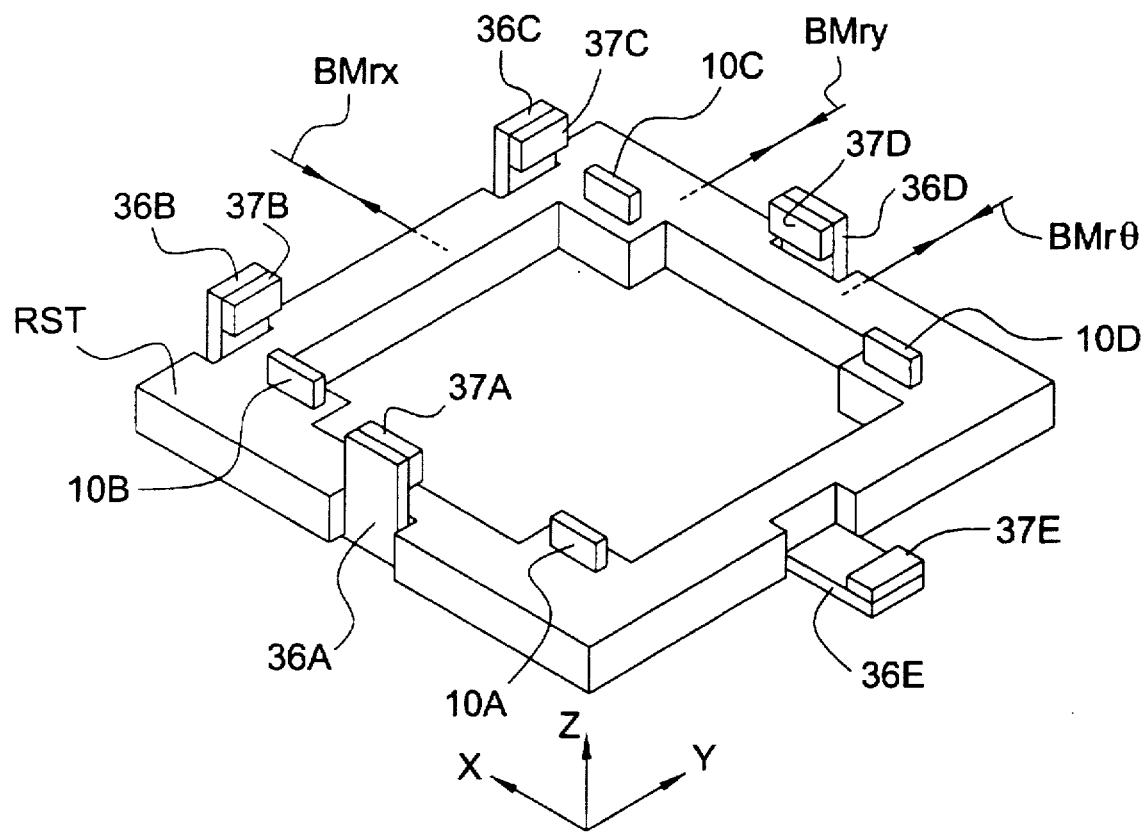
FIG. 5 is a perspective view showing the structure of the reticle stage according to a second embodiment of the invention.

A second embodiment of the invention will now be described with reference to FIG. 5. FIG. 5 shows a modification of the reticle stage RST of FIG. 1. The four corners of the reticle R are supported on the four mounts 10A, 10B, 10C and 10D, similar to FIG. 3. However, in this embodiment, the reticle R is mounted on the reticle stage only by its own weight, without applying vacuum adsorption to the mounts, or with very soft vacuum adsorption.

In this situation, movable pushers 36A, 36B, 36C, 36D and 36E positioned along the periphery of the reticle stage RST softly push each of the side surfaces of the reticle R. When the reticle R is being transported onto the mounts 10A–10D, the movable pushers 36A–36E are in a state of being opened outward, as is shown by the movable pusher 36E in FIG. 5. When the reticle R is positioned on the mounts 10A–10D with a mechanical pre-alignment precision (e.g., within ±1 mm), the five movable pushers 36A–36E are raised vertically to push the corresponding side surfaces of the reticle R toward the center point CC of the reticle R. The reticle R is positioned more precisely on the reticle stage RST by this gentle pushing force. The rotational positioning precision of the reticle R is set so that the measuring beams BMrx, BMry and BMrθ are reflected from the corresponding reflective areas SX, SY and Sθ on the side surface of the reticle at exactly the right angle to ensure accurate interference measurement.

When the positioning has been accomplished, the movable pushers 36A–36E are maintained at a slightly opened outward position so that elastic abutments 37A, 37B, 37C, 37D and 37E are in loose contact with the reticle side surfaces. The elastic abutments 37A–37E are formed on the movable pushers 36A–36E, respectively, so as to face the reticle side surfaces when the movable pushers 36A–36E are raised. If the reticle R expands due to, e.g., heat energy during a later process, the side surfaces of the reticle R will slightly deform the inner surfaces of the elastic projections 37A–37E outward.

When the reticle R is set on the reticle stage RST, the counter circuit units 22X, 22Y and 22θ (FIG. 4) are reset to an initial value, and the CPU 24, interface circuit 26, and servo circuits 28A, 28B and 28C immediately start controlling the driving units 12A, 12B and 12C. The reference mark on the reference plate FM formed on the wafer stage WST (FIG. 1) is positioned in the field of view of the projection optical system PL. The alignment system 20A, 20B simultaneously detects the marks M1, M2 on the reticle R and the reference mark on the reference plate FM to calculate the relative positional error and rotational displacement (error), and sends a command to the CPU 24 to correct such errors.

In response to the command, the driving units 12A, 12B and 12C finely move the reticle stage RST to achieve precise alignment between the marks M1, M2 of the reticle R and the reference mark on the reference plate FM. When the precise alignment is accomplished, the driving units 12A, 12B and 12C stop. At this point, the CPU 24 reads the measurement values of the counter circuit units 22X, 22Y and 22θ and stores them as initial values. The initial values represent the position of the reflective areas SX, SY and Sθ of the reticle R before expansion.

Figure 6:
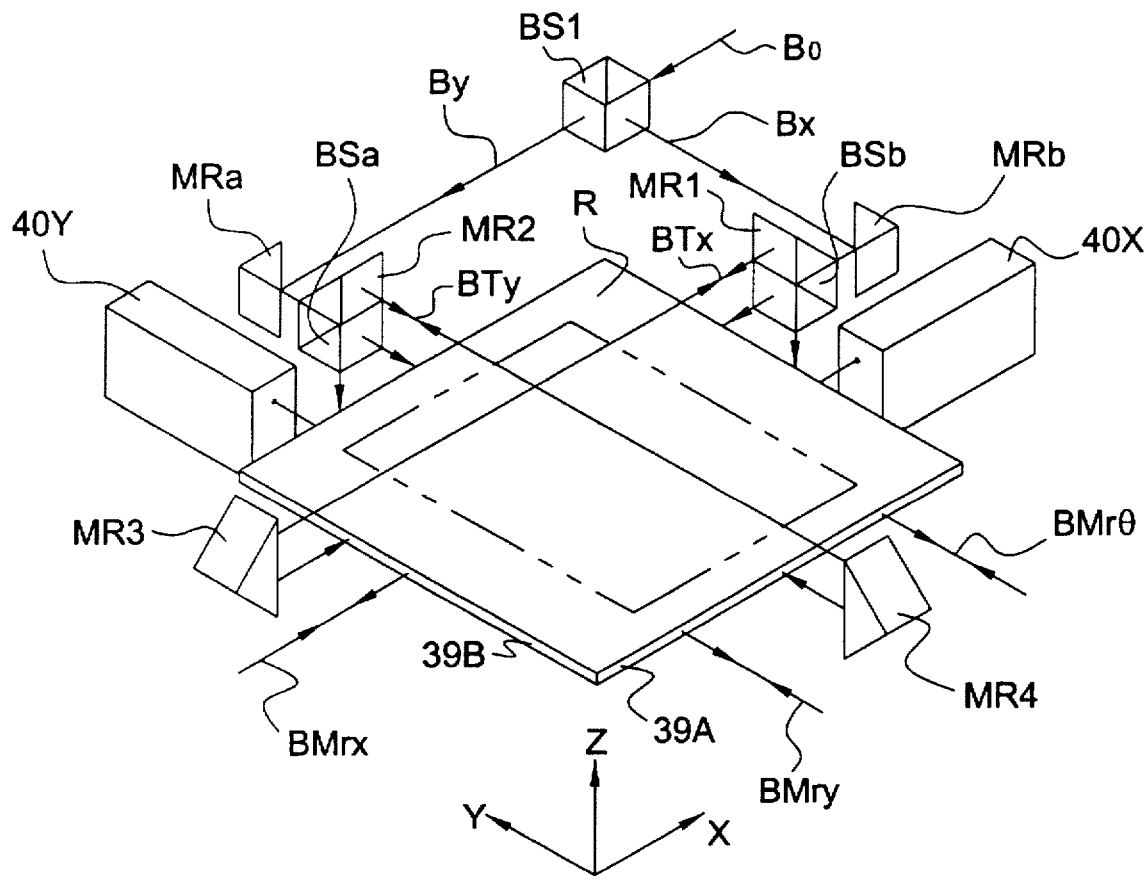
FIG. 6 is a perspective view showing the structure of the reticle stage according to a third embodiment of the invention.

FIG. 6 shows the reticle R and the reticle stage in accordance with a third embodiment of the invention. The reflective areas are formed on the entire surface of the four side surfaces of the reticle R. The expansion amount of the reticle R, caused by temperature change, is directly measured by a dedicated interferometer system designed so as to directly measure the change in the distance between two parallel sides of the reticle R. That is, the change in reticle size in the X and/or Y directions is detected.

One of the interferometer systems for expansion amount measurement will now be described. A beam splitter BS1 splits a laser beam B0 into beams Bx and By. A mirror MRa reflects the beam By in the Y direction. A beam splitter BSa receives the beam By from the mirror MRa and splits the beam By into transmissive beams that advance to the side surface of the reticle R that extends in the X direction and into a reflected beam that advances toward the upper mirror MR2. A corner mirror MR4 receives the beam BTy, which has been reflected by the mirror MR2 into the Y direction parallel to the main surface of the reticle R, at the opposite side of the reticle R, and reflects it to the side surface 39A of the reticle R at a right angle. A receiver 40Y receives the interference beam between the reflected beams, which has been reflected from the side surface 39A and returned to the beam splitter BSa through the corner mirror MR4 and mirror MR2, and the reflected beams, which have been reflected from the side surface of the reticle R on the beam splitter BSa side and returned to the beam splitter BSa.

The information measured by the receiver 40Y represents a change in reticle size in the Y direction. The other interferometer system for expansion amount measurement in the X-direction has the same structure. The beam Bx is reflected by the mirror MRb and is further split into two beams by the beam splitter BSb. One beam is guided to the side surface of the reticle R extending in the Y direction, and the other beam reaches the side surface 39B of the opposite side of the reticle R through mirror MR1 and corner mirror MR3. The two reflected beams from two parallel side surfaces interfere with each other at the beam splitter BSb, and the resultant interference beam is received at the receiver 40X. The information measured by the receiver 40X represents the change in reticle size in the X direction.

In this interferometer system, beam splitter BS1, mirrors MRa, MRb, MR1–MR4, beam splitters BSa, BSb (functioning as interference units), and receivers 40X, 40Y are basically built on the reticle stage shown in FIGS. 3 and 5. However, if the system is designed so that the incident beams Bx, By to the beam splitters BSa, BSb, respectively, are guided by a single mode optical fiber and the interference beams from the beam splitters BSa and BSb are also guided by an optical fiber, then the mirrors MRa, MRb, MR1–MR4, and beam splitters BSa, BSb are attached on the reticle stage RST, and the other components, such as receiver 40X, 40Y, may be attached to the reticle base column structure CL1.

The reticle R is mounted on the mounts 10A–10D of the reticle stage RST (FIGS. 3, 5) so as not to prevent free expansion of the reticle R. After the reticle R is precisely positioned on the reticle stage RST using the alignment systems 20A, 20B (FIG. 1) and the reference plate FM, the counter circuit that converts the measurement information from the receivers 40X, 40Y into digital values is reset to start counting.

If the reticle R does not expand, the counter value of the counter circuit does not change. If the reticle R slightly expands, the counter value changes from the initial value. By reading the change, the expansion amounts in the X and Y directions are immediately obtained. Accordingly, the positional shift of the center point CC of the reticle R due to the expansion component can be accurately calculated, based on the changed value.

If the projection exposure apparatus of FIG. 1 is equipped with a TTL (through-the-lens) alignment system that detects the mark on the wafer W through only the projection optical system PL, or an off-axis type wafer alignment system that is fixed outside the projection optical system PL and detects the mark on the wafer W (as disclosed in, for example, Japanese Laid-Open Patent Application No. 5-21314), it is necessary to precisely measure the relative distance (base line) between the projection point of the center CC of the reticle R and each of the mark detection center points of the TTL alignment system or off-axis alignment system, using a reference plate FM on the wafer stage WST, after the reticle R is mounted.

The base line measuring action is generally performed immediately after a single reticle is mounted on the exposure apparatus. However, the base line measuring action may be performed in an appropriate time interval during the continuous exposure process. If this is the case, the values counted in the counter circuit through the receiver 40X and 40Y are read out by the CPU 24 and are stored as initial values every time base line measurement is performed. Alternatively, the counter circuit connected to the receivers 40X, 40Y may be reset every time base line measurement is performed.

According to the interferometer system for expansion amount measurement shown in FIG. 6, the expansion amount of the reticle R in the X direction and in the Y direction is directly measured, and the change in the distance between the reticle center point CC and the side surfaces 39A, 39B, to which the measuring beams BMrx, BMry and BMrθ are emitted from the interferometers IFRX, IFRY and IFRθ, is measured. Consequently, the positional change of the projected point of the reticle center point CC is precisely determined in real time, and the alignment precision between the reticle R and the wafer W is accurately controlled during exposure.

Figure 7:
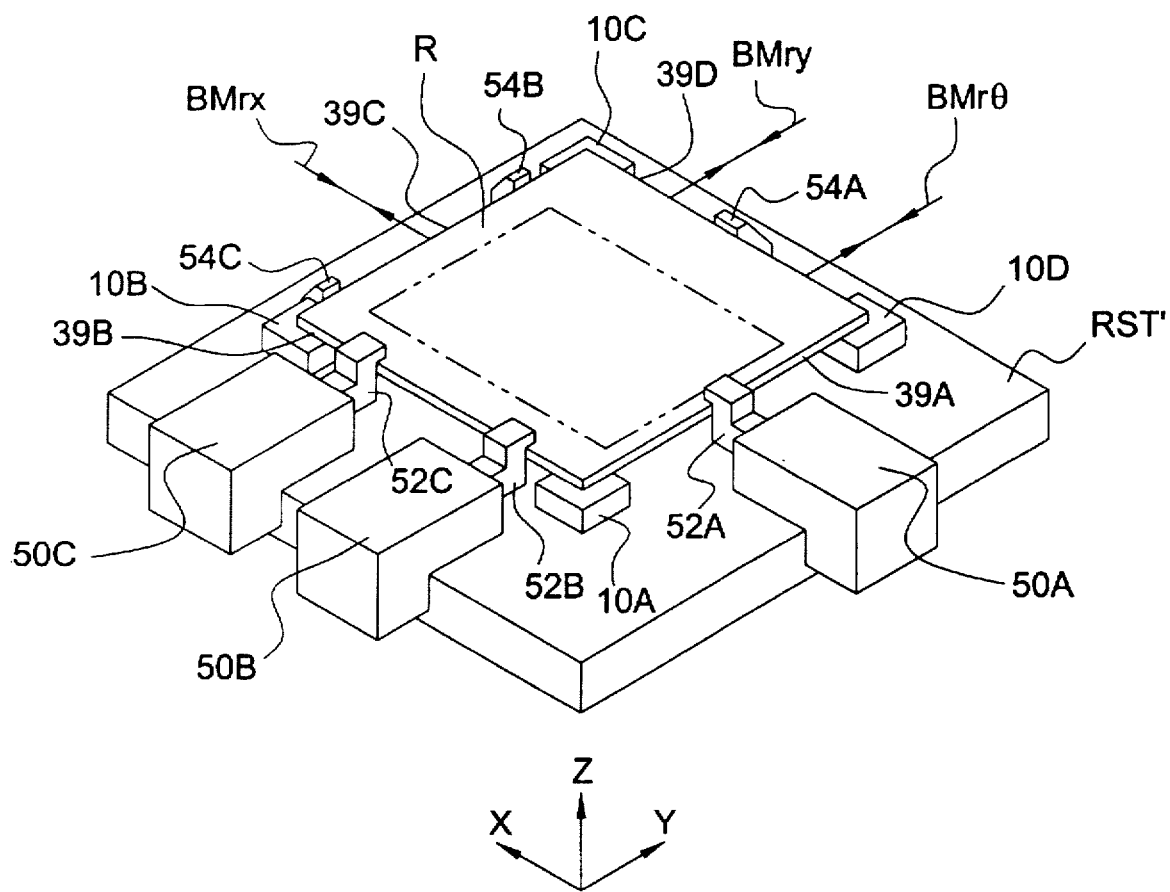
FIG. 7 is a perspective view showing the structure of the reticle stage according to a fourth embodiment of the invention.

FIG. 7 shows the reticle stage of a fourth embodiment of the invention. Unlike the embodiments described above, the reticle stage RST' of FIG. 7 is fixed to the reticle column structure CL1 (FIG. 1), and moves between the exposure position and the reticle receiving position only when the reticle is changed. The reticle R is mounted on the four mounts 10A, 10B, 10C and 10D on the reticle stage RST'. Positioning of the reticle R is performed by three linear actuators 50A, 50B and 50C (such as, e.g., a piezoelectric device, a miniature linear motor, and a voice coil type motor), which directly push the corresponding side surface of the reticle R. The reticle R used in this embodiment is one in which the entire area of the four side surfaces are polished (e.g., ground) to form reflective areas.

When the reticle R is mounted on the mounts 10A–10D with mechanical pre-alignment, pusher 52A of the actuator 50A is driven in the X direction toward the side surface 39A of the reticle R, while pushers 52B and 52C of the actuators 50B and 50C, respectively, are driven in the Y direction toward the side surface 39B of the reticle R. On the contact portion of each of the pushers 52A, 52B and 52C, which comes into contact with the side surfaces of the reticle R, a chip made of, e.g., a steel ball or plastics (synthetic resins) is provided so as to minimize the friction coefficient.

When the two side surfaces 39A and 39B are pushed by the pusher 52A, 52B and 52C, reticle R finely moves in the X and Y directions, which causes the opposite side surfaces 39C and 39D to contact the elastic abutments 54A, 54B and 54C. The elastic abutment 54A makes point contact with the side surface 39D at the center thereof, and is elastically displaced in the Y direction within a predetermined range (e.g., within several millimeters). The elastic abutments 54B and 54C make point contact with the side surface 39C at both ends thereof, and are elastically displaced in the X direction within a predetermined range (e.g., within several millimeters). The elasticity of the elastic abutments 54A, 54B and 54C is selected so as not to prevent free expansion of the reticle R.

The reticle R is finely moved in the X and Y directions by driving the actuators 50A, 50B and 50C, and the elastic abutments 54A, 54B and 54C are elastically displaced halfway in their available stroke. At this point, alignment of the reticle R is substantially accomplished with mechanical accuracy. Then, the actuators 50A, 50B and 50C are finely driven so that the marks M1, M2 on the reticle R are aligned with the reference plate FM more precisely, using the alignment system 20A, 20B and the reference mark on the reference plate FM. As a result, the center point CC of the reticle R is precisely aligned with respect to the coordinate system of the wafer stage WST.

Information about the expansion amount of the reticle R is provided by the temperature measuring system shown in FIG. 4 or the interferometer system of FIG. 6, similar to the first and third embodiments. Linear and rotational displacement of the center point CC due to the expansion, as well as the positional shift in the X and Y directions and the rotational shift of the reticle R itself with respect to the mounts 10A–10D, are corrected based on the measurement information. Wafer stage WST may be used to perform error correction in the X and Y directions, in addition to the actuators 50A, 50B and 50C positioned on the reticle side.

Since the driving power is directly applied to the side surface of the reticle R, the measurement surfaces that receive the measuring beams BMrx, BMry and BMrθ from the reticle interferometers IFRX, IFRY and IFRθ, and the surfaces that contain a plurality of driving points in the actuators, are substantially the same. Consequently, control accuracy of the servo control system is improved without being subject to the influence of slip between the mounts 10A–10D and the reticle R.

Figure 8:
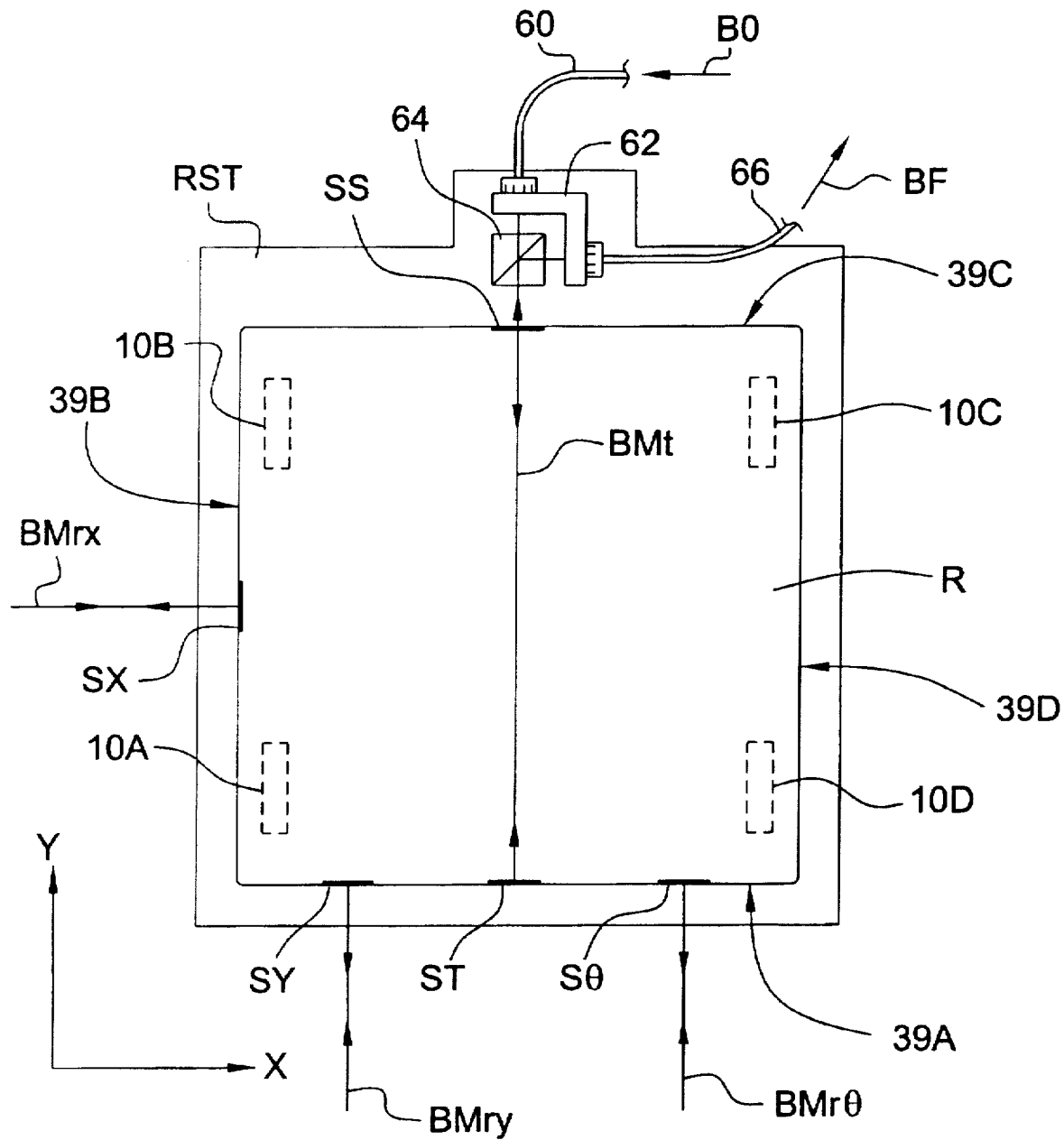
FIG. 8 is a plan view showing the structure of the interferometer system for expansion amount measurement in accordance with a fifth embodiment of the invention.

FIG. 8 shows a modification in accordance with a fifth embodiment of the invention in which a fiber interferometer system for directly measuring the expansion amount of the reticle R is employed. In this embodiment, a light splitting area of dielectric film is formed on at least one side surface of the reticle R. The same numerals denote the same elements as in the previous embodiments.

The reticle R is mounted on four mounts 10A–10D on the reticle stage RST. Vacuum adsorption is applied to only one of the four mounts to support the reticle R, similar to the first embodiment. Reflective area ST is formed on the side surface 39A, in addition to the reflective areas SY and Sθ, to which measuring beams BMry, BMrθ are projected from the reticle interferometers IFRY, IFRθ. The reflective area ST is formed on a part of the side surface 39A that is polished by surface-grinding, and is used as a back reflector. Therefore, the reflective layer may be deposited (i.e., via deposition) on the entire area of the side surface 39A.

On the side surface 39C opposite the side surface 39A, a partial reflective area SS is formed with dielectric film. Expansion amount measuring beam BMt enters into the reticle R through the partial reflective area SS in parallel with the main surface of the reticle R. The measuring beam BMt is emitted to the partial reflective area SS on the side surface 39C with a substantially normal incident angle through a single mode optical fiber 60, which receives a linear polarized beam B0 from the laser source. A metal fitting 62 fixes the exit end of the optical fiber 60 to the reticle stage RST. A beam splitter 64 is fixed to the reticle stage RST and functions as an interference unit. A ¼ wave plate (e.g., a retardation sheet) is provided between the beam splitter 64 and the side surface 39C, although it is not shown in the figure.

Accordingly, the beam projected to the partial reflective area SS becomes circular polarized light. A portion of the circular polarized light beam is reflected from the partial reflective area SS back to the beam splitter 64 through the ¼ wave plate, which makes the beam linear polarized light perpendicular to the original light beam. The beam reflected by the beam splitter 64 enters the light-receiving optical fiber 66, and is guided to a receiver (e.g., a photoelectric detection device). On the other hand, the beam which has passed through the partial reflective area SS becomes measuring beam BMt and reaches the reflective area ST on the opposite side surface 39A. The beam reflected by the reflective area ST returns along the same light path as the measuring beam BMt to the beam splitter 64 through the partial reflective area SS and the ¼ wave plate. The beam is further reflected by the beam splitter 64 and enters the optical fiber 66.

The reflected beam from the partial reflective area SS on the side surface 39C, and the reflected beams from the reflective area ST on the side surface 39A, interfere with each other to generate interference beam BF, which is received at the receiver. The receiver detects the change in the Y direction, that is, the change in the distance between the partial reflective area SS on the side surface 39C and the reflective area ST on the side surface 39A, with a resolution of less than $1/100$ μm. The interferometer system comprised of beam splitter 64 and receiver can directly measure the expansion amount of the reticle in the Y direction.

The dielectric film (multi-layered film) that functions as a partial reflective area SS on the side surface 39C preferably has a reflectance of 33% and a transmittance of 67%. Furthermore, since the beam B0 guided to the beam splitter 64 is supplied from the optical fiber 60, it is preferable to make the numerical aperture (N.A.) of the exit end of the optical fiber 60 as small as possible to maintain the collimation of the beam MBt. The system may be designed so that the beam B0 enters the beam splitter 64 through a reflector fixed on the reticle base column structure CL1 (FIG. 1) without using the optical fiber 60.

Figure 9:
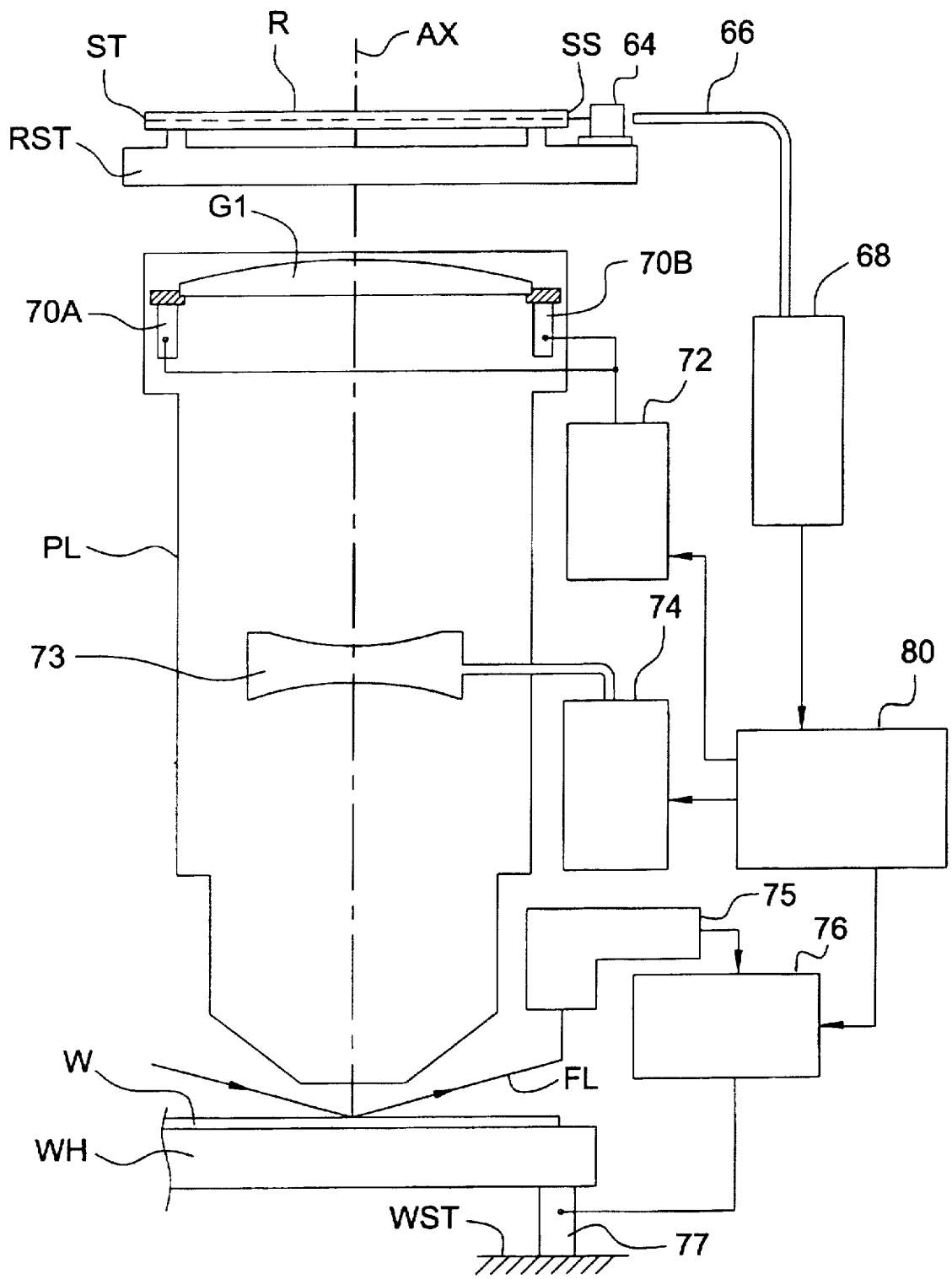
FIG. 9 is a schematic side view showing the structure of the projection exposure apparatus in accordance with a sixth embodiment of the invention.

FIG. 9 shows a projection exposure apparatus in accordance with a sixth embodiment of the invention. The beam splitter 64, which constitutes the expansion amount measurement interferometer system of FIG. 8, is fixed to the reticle stage RST, and the interference beam between the reflected beam from the reflective area ST on the side surface 39A and the reflected beam from the partial reflective area SS on the side surface 39C is received through optical fiber 66 at the receiver 68. The signal from the receiver 68 is input to the processor unit 80, which includes a counter circuit and a CPU. The processor unit 80 calculates the expansion amount from the initial state of the reticle R in real time. In this embodiment, a fine dimensional error (which will appear as a magnification error) in the circuit pattern image on the wafer W due to expansion of the reticle R is corrected based on the measured expansion amount data.

To achieve this correction, the apparatus is designed so that the field lens G1 positioned in the telecentric unit of the projection optical system PL can be translated, or moved with a tilt, in the direction of the optical axis AX. For such purpose, a plurality of piezoelectric devices 70A, 70B for moving the field lens G1 are provided to the apparatus. The imaging magnification and distortion aberration of the projection optical system PL can be delicately adjusted by controlling the driving amount of the piezoelectric devices 70A, 70B using the drive control circuit 72.

The focussing magnification of the projection optical system PL may be finely adjusted by sealing an appropriate air gap (air lens) 73 within the projection optical system and by adjusting the internal pressure using a pressure control system 74. In order to correct the displacement of the optimum image formation plane in the optical axis (AX) direction, which is secondarily (derivatively) caused by the positional adjustment of the field lens G1 and the pressure adjustment of the air lens 73, the apparatus is equipped with an oblique incident automatic focusing system that includes a detection system 75 for emitting imaging light obliquely to the wafer surface and for receiving the reflected light FL to detect the position of the wafer W in the optical axis direction, a plurality of actuators 77 for moving the holder WH adsorbing the wafer W in the Z direction, and a drive control system 76 for driving the actuators 77. Examples of oblique incident automatic focussing systems can be found in U.S. Pat. No. 4,558,949 and U.S. Pat. No. 5,448,332, the disclosures of which are incorporated herein by reference in their entireties.

The processor unit 80 determines the enlarged or reduced scale (ppm) of the circuit pattern area on the reticle R with the center point CC as a base point, based on the measured expansion amount of the reticle R from the initial state, and outputs correction information to either the drive control circuit 72 or to pressure control system 74 so that the error (displacement) correction is executed corresponding to the scale. In response to the output, positional adjustment (correction) of the field lens G1 or internal pressure adjustment (correction) of the air lens 73 is performed, and the dimensional error in the projected image on the wafer W is corrected.

The drive control circuit 72 for controlling the position of the field lens G1, the pressure control system 74 for controlling the internal pressure of the air lens 73, and the drive control system 76, which functions as an oblique incident automatic focusing system also have a function for correcting the fluctuation in the image formation property due to change in the atmospheric pressure of the projection optical system PL, due to partial absorption of the illumination energy during exposure, or due to change in the condition of the illumination light from the illumination optics for illuminating the reticle, as is disclosed in Japanese Laid-Open Patent Application Nos. 60-78454 and 62-229838, the disclosures of which are incorporated herein by reference in their entireties.

Since, in the embodiment, the expansion amount from the initial state of the reticle R is directly measured by the interferometer system from moment to moment, apparent change in magnification due to the expansion of the reticle R can also be corrected in real time, whereby all types of image forming errors occurring in the image formation light path (from the reticle pattern to the wafer surface) can be corrected.

In the embodiments described above, it is a main object to measure the expansion amount of the reticle (mask substrate) due to heat accumulation and to correct alignment errors and projection magnification errors caused by such expansion. However, if a duct, for example, is provided that can supply precisely temperature-controlled air to the reticle R on the reticle stage RST with a predetermined flow velocity to sufficiently restrain the temperature rise due to heat accumulation, then temperature sensors for detecting the temperature of the reticle R, or an interferometer system for directly measuring the expansion amount, may be omitted.

However, even in that situation, it is still preferable to detect the displacement amount of the reticle R in the X, Y and θ directions using the reflective area (mirror surface) formed on the side surface of the reticle R and interferometers IFRX, IFRY and IFRθ, and to finely adjust the reticle R based on the measurement information. The conventional apparatus that has a reflector fixed to the reticle stage RST for fine movement cannot detect microscopic slip (positional shift or displacement) of the reticle R itself, as mounted on the reticle stage RST.

In the above embodiments, at least a portion of the side surfaces of the reticle R (mask substrate) is polished by a mirror grinding technique, onto which a reflective layer is formed of reflective material deposition. The reflective layer is preferably formed before the circuit pattern is printed on the quartz substrate as a material of reticle R.

Generally, in the manufacturing process of reticle R, the quartz substrate (which can be, e.g., 6 inches square with a thickness of 5 mm), as the raw material, is optically ground so that the top and bottom surfaces become parallel within an acceptable error range. Then, a chromium layer having a low reflectance is deposited (e.g., by evaporation) on the entire area of one of the surfaces of the quartz substrate. This layer is further coated with a "resist" (e.g., a photoresist) for use in electron-beam exposure (EB exposure). After the quartz substrate coated with resist is mounted on an EB exposure sample stage with mechanical pre-alignment, printing of the circuit pattern or mark pattern begins.

When the circuit pattern is exposed and projected onto the quartz substrate, the exposed portion of the photoresist is removed. The remaining photoresist on the chromium layer forms a resist image. The exposed substrate is further etched using the resist image as a masking, by a development process, thereby removing a portion of the chromium layer to make a reticle. The removed portion of the chromium layer will correspond to a transparent portion of the circuit pattern. In order to form a reflective area or partial reflective area on the side surface of the reticle R, all of the four side surfaces are ground during the step of polishing the quartz substrate as a raw material, and a chromium layer (or a dielectric multi-layered film) is formed on all or some of the four side surfaces during the step of evaporating the chromium layer on the entire surface of the quartz substrate.

The sample stage of the EB exposure apparatus is equipped with reference pins that come into contact with two orthogonal side surfaces (e.g., side surfaces 39A and 39B in FIGS. 6 and 8) of the quartz substrate to position the quartz substrate on the sample stage. In this state, EB exposure is conducted to the resist on the quartz substrate that is positioned on the sample stage. The circuit pattern and alignment marks to be printed are positioned using the two side surfaces as references.

The position of the circuit pattern is precisely defined by the two side surfaces. As a result, the reference point for pattern positioning for completing the reticle R is in agreement with the reference point for measurement by the reticle interferometer system of the projection exposure apparatus. The agreement of the reference points prevents alignment accuracy with the wafer W from being reduced due to the printing error (positioning error) of the pattern on the reticle R.

A moving mirror is fixed to the periphery of the sample stage of the EB exposure apparatus, for use in the measuring system using laser interferometers. A seventh embodiment relates to an improved sample stage of the EB exposure apparatus, which will be described below with reference to FIG. 10.

The quartz substrate QP is mounted on the sample stage 90. The EB exposure apparatus preferably includes interferometers EIX and EIY that emit (project) measuring beams Bex and Bey to the side surfaces 39A and 39B, respectively. Preferably, the position of the sample stage 90 is adjustably controlled using the side surfaces 39A and 39B of the quartz substrate QP as references, in response to the measuring results from the interferometers EIX and EIY.

More particularly, flatness in the side surfaces 39A and 39B of the quartz substrate QP in the extending direction is generally not preferable. Therefore, position control of the sample stage 90 is performed by the interferometer systems SIX and SIY using conventional moving mirrors MRwx and MRwy fixed on the sample stage 90, and the separate interferometers EIX and EIY are used for measuring the flatness of the side surfaces 39A and 39B.

Figure 10:
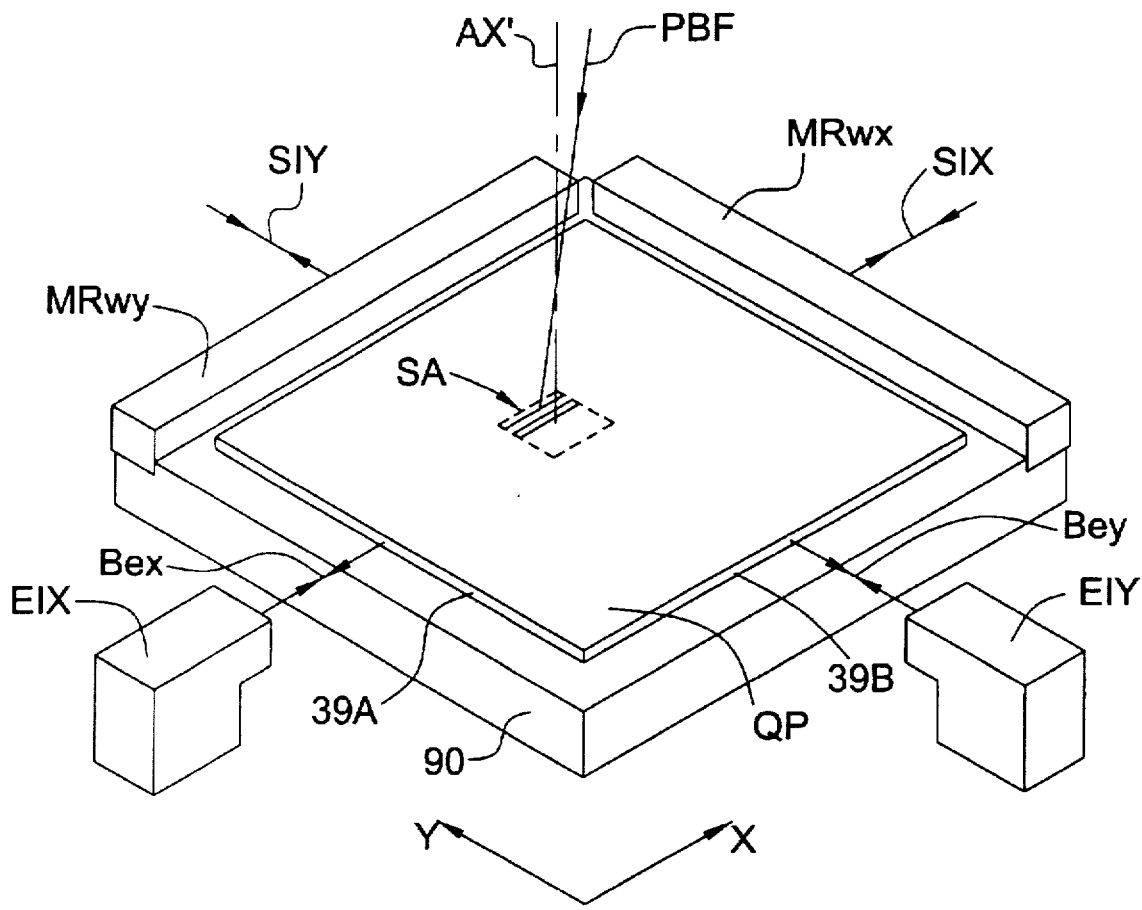
FIG. 10 is a perspective view showing the structure of the sample stage of the electron beam (EB) exposure apparatus that executes the reticle manufacturing method in accordance with a seventh embodiment of the invention.

In FIG. 10, the electronic lens system of the EB exposure apparatus has an optical axis AX', and an electron beam (charged particle beam) PBF is emitted to the quartz substrate for printing the pattern. SA denotes a shot area that can be exposed by deflection of the beam PBF.

The sample stage 90 is linearly moved, for example, in the X direction, based on the coordinate values obtained by the interferometer systems SIX and SIY, while successively sampling the measurement values of the side surfaces 39B detected by the interferometer EIY, thereby obtaining the degree of flatness of the side surface 39B and the level to which it is parallel to the X axis. Similarly, as for flatness and deviation from the parallel plane to the X axis, the sample stage 90 is linearly moved in the Y direction based on the coordinate values from the interferometer systems SIX and SIY, while successively reading the measurement values from the interferometer EIX.

During actual printing of the pattern, print position errors arising from the dispersion in flatness and deviation from the parallel plane of the side surfaces 39A and 39B is finely corrected by adjusting the transporting position of the sample stage 90 and the deflecting position of the exposure beam PBF. Thus, the circuit pattern is precisely positioned and printed using the side surfaces 39A and 39B as reference marks.

Figure 11:
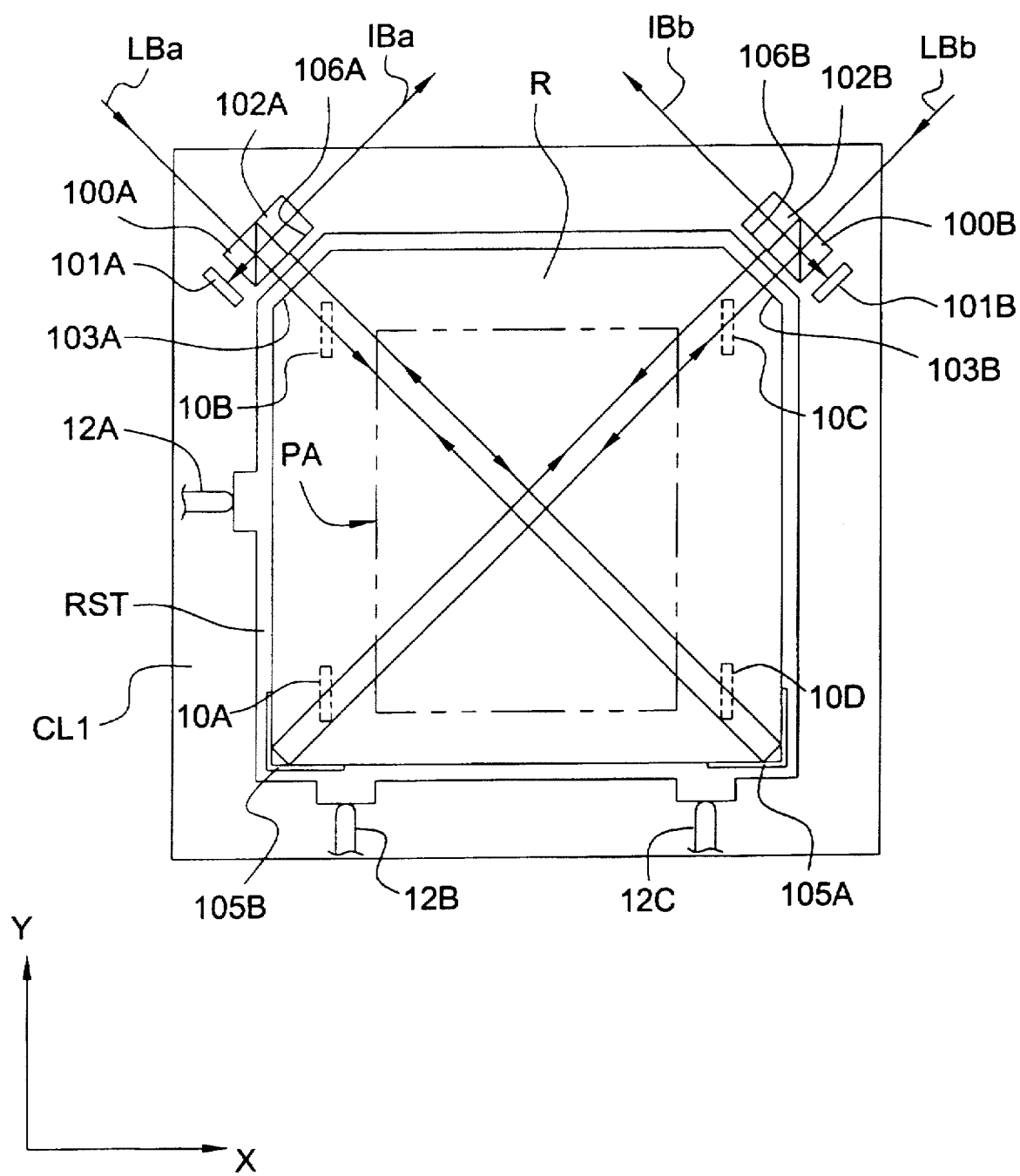
FIG. 11 is a plan view showing the structure of the reticle interferometer system in accordance with an eighth embodiment of the invention.

FIG. 11 is a plan view of the reticle stage R in accordance with an eighth embodiment of the invention. The reticle stage RST supports the reticle R with four mounts 10A–10D. The reticle stage RST is moved on the reticle base column structure CL1 in the X, Y and θ directions by the driving units 12A–12C. The position of the reticle R in the X and Y directions is directly measured by the reticle interferometer system.

The reticle R used in this embodiment has cut-off side surfaces 103A and 103B, which are formed by cutting off and polishing two corners of the reticle R diagonally (by 45°). Reflective layers are formed on the side surfaces that extend in the X and Y directions and define the other two corners 105A and 105B of the reticle R. The interferometer system of this embodiment is designed so as to measure the displacement of the reticle R in the X and Y directions and rotation in the θ direction by detecting positional shift components of the two corners 105A and 105B of the reticle R in the direction of 45° from the X or Y axes.

In the first interferometer system, measuring laser beam LBa enters the beam splitter 100A fixed to the reticle base column structure CL1 from the 45° angle direction with respect to the X–Y coordinate system. The reflected component of the beam LBa reflected from the beam splitter 100A is guided to the reference mirror 101A fixed to the reticle base column structure CL1 at a right angle, and is reflected at a normal angle. The beam reflected by the reference mirror 101A passes through the beam splitter 100A and glass block (e.g., a rectangular solid) 102A.

On the other hand, the transmissive component of the beam LBa, which has passed through the beam splitter 100A, enters into the reticle R from the diagonal (45°) side surface 103A in a direction parallel with the main surface of the reticle R, and is reflected by the rear surface of the reflective layer formed on the opposite corner 105A over two orthogonal side surfaces. The reflected beam exits from the diagonal (45°) side surface 103A and reaches the total reflection surface 106A of the glass block 102A. The beam reflected by the total reflection surface 106A traces the same light path in the opposite direction, exits from the diagonal side surface 103A, and is reflected by the beam splitter 100A. This beam passes through the glass block 102A and is combined with the other beam component reflected from the reference mirror 101A to generate interference beam IBa.

The interference beam IBa is photoelectrically detected by the receiver of the first interference system, and the detection signal is connected to the counter circuit of the later stage. As a result, the first interference system measures the positional shift of the corner 105A (the apex) of the reticle R in the diagonal (45°) direction with respect to the total reflection surface 106A of the glass block 102A.

The second interference system has a similar structure. The measuring beam LBb is split by the beam splitter 100B into two components. One beam component is normally reflected by the reference mirror 101B and passes through the beam splitter 100B and glass block 102B. The other beam component enters into the reticle R from the diagonal (45°) side surface 103B in a direction parallel to the main surface of the reticle R, and is reflected by the reflective layer formed on the opposite corner 105B over the two orthogonal side surfaces. The beam exits from the diagonal (45°) side surface 103B and reaches the total reflection surface 106B of the glass block 102B.

The beam is further reflected by the total reflection surface 106B, traces the same light path in the opposite direction, and exits from the side surface 103B. The beam is reflected by the beam splitter 100B, passes through the glass block 102B, and is combined with the beam component reflected from the reference mirror 101B to become interference beam IBb, which is then received by the receiver.

The second interferometer system measures the positional shift of the corner 105B of the reticle R in a diagonal (45°) direction, with respect to the total reflection surface 106B of the glass block 102B.

Two corners 105A and 105B of the reticle R work as corner mirrors, using the first and second interferometer systems. Therefore, even if there is a rotational shift of the reticle R within the X–Y plane, the position of the reflected beams that return from the total reflection surfaces 106A and 106B of the glass blocks 102A and 102B, respectively, do not shift.

Since displacement of two corners 105A and 105B of the reticle R are measured in the diagonal (45°) direction by the first and second interferometer systems, coordinate conversion is required to determine the displacement in the X and Y directions. However, the advantage of this structure is that even when the reticle R is mounted on the reticle stage RST with a relatively large rotational shift (about 2–3°), the interference systems, making use of the side surfaces of the reticle R, can normally function without reduction in precision.

Therefore, mechanical pre-alignment accuracy for initially mounting the reticle R on the reticle stage RST can be reduced, and pre-alignment speed can be increased. This results in reduced time in replacing reticle R.

Figure 12:
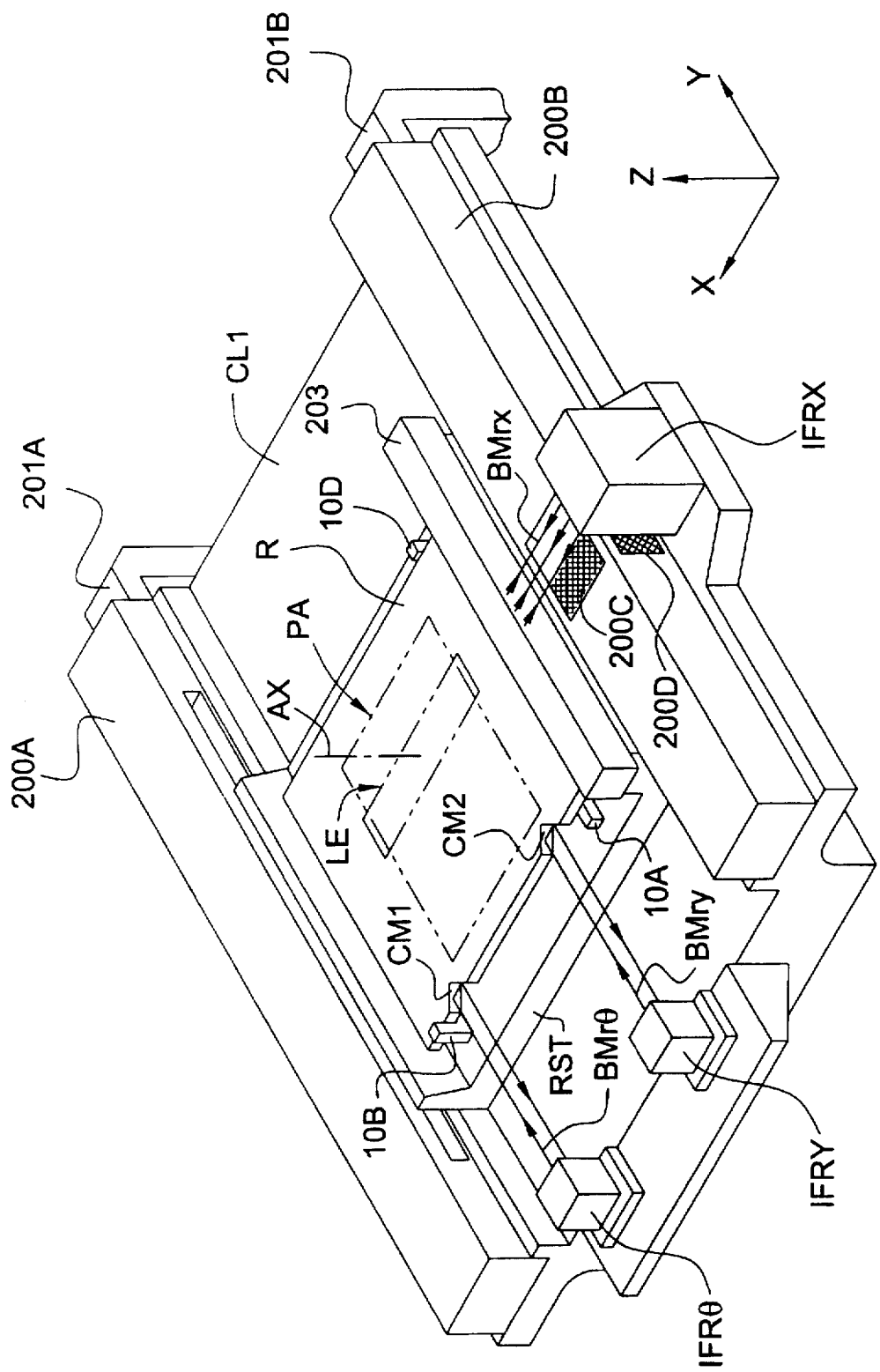
FIG. 12 is a perspective view showing the structure of the reticle stage of the projection exposure apparatus in accordance with a ninth embodiment of the invention.

A ninth embodiment of the invention will now be described with reference to FIG. 12. FIG. 12 is a perspective view showing the structure of a reticle base column structure CL1 and a reticle stage RST that are suitable for a step-and-scan type projection exposure apparatus. When used in the step-and-scan type of apparatus, reticle R is mounted on the reticle stage RST of FIG. 12, which is one-dimensionally moved along the Y direction with a stroke corresponding to the dimension of the reticle R (e.g. 6 inches) on the reticle base column structure CL1.

The one-dimensional movement is performed by the linear motor units 200A and 200B that extend in the Y direction on both sides of the reticle stage RST. Each of the linear motor units 200A and 200B is entirely covered with a housing. Air heated by the motor coil within the motor units 200A, 200B is forcibly exhausted by the exhaust ducts 201A and 201B.

Moving mirror 203 extending in the Y direction is fixed on one end of the X direction of the reticle stage RST. Three measuring beams BMrx from the reticle interferometer IFRX used for X direction measurement, the interferometer being fixed in base structure CL1, are vertically projected on the moving mirror 203. This interferometer IFRX performs measurement of minute positional changes and minute rotational errors of the X direction (non-scanning direction) of the reticle stage RST. Moreover, a plurality of meshlike openings 200C and 200D are formed directly under measuring beams BMrx in the cover of linear motor unit 200B; whereby a flow caused through exhaust duct 201B of the air surrounding measuring beams BMrx draws the heated air through each opening 200C and 200D. Through this structure, and through the cover of motor unit 200B becoming warm, fluctuation of the light paths of measuring beams BMrx is prevented.

Reticle R is positioned onto four mounts 10A–10D on stage RST (mount 10C is hidden under reticle R, so it is omitted from FIG. 12). However, in this preferred embodiment, in order to prevent the shifting of reticle R toward the Y direction (the scanning direction), due to the acceleration and deceleration of stage RST during scanning exposure, a protrusion component is formed on one part of mounts 10B and 10D, so that the side surfaces of reticle R positioned diagonally will be pressured with a gentle application of force along the Y axis. Moreover, in the preferred embodiment of this invention, all of the mounts 10A–10D maintain reticle R with gentle vacuum adsorption or, alternatively, any one of mounts 10B and 10D can maintain reticle R with strong vacuum adsorption.

At two locations on one side extending in the X direction of reticle R, notch corners CM1 and CM2 are formed at exactly 90° in the main surface of reticle R. Further, the slanted surfaces of each of the notch corners CM1 and CM2 are optically ground and a reflective layer is deposited on those surfaces. Accordingly, notch corners CM1 and CM2 operate as one type of corner mirror, to reflect measuring beams BMry and BMrθ emitted from reticle interferometers IFRY and IFRθ, respectively, which are fixed in base column structure CL1 and are used for Y direction measurement. These measuring beams BMry and BMrθ irradiate one of the slanted surfaces of notch corners CM1 and CM2, respectively, and return to interferometers IFRY and IFRθ from the other slanted surface parallel to the incident light path. As a result, each interferometer IFRY and IFRθ perform measurement of the position of the Y direction summit point of each of the two corner parts CM1 and CM2.

In this way, corner parts CM1 and CM2 are constructed on one side of reticle R, so that angle variation is prevented in each reflective beam of measuring beams BMry and BMrθ occurring through the rotation of reticle R. A state of interference from each interferometer IFRY and IFRθ is allowed within the rotational range of reticle R, which is an advantage of this preferred embodiment. So as to obtain this advantage, it is necessary that interval Lk, in the X direction of each measuring beam BMry and BMrθ of interferometers IFRY and IFRθ, be in agreement with the interval of the X direction of corner parts CM1 and CM2, which are constructed in reticle R. This means that all reticles will have to be prepared (by different manufacturers) with the same interval. However, if standards can be determined for quartz plates used for this type of reticle, exposure device manufacturers can easily adapt to this requirement.

Stage RST, denoted in FIG. 12, is supported on base structure CL1 through air-bearings, and is moved in a non-contact manner by linear motor units 200A and 200B. Assuming that the position coordinates for each Y direction of corner parts CM1 and CM2, measured by each of the two interferometers IFRY and IFRθ, are Yc1 and Yc2, then the rotational variable amount, Δθc, can be obtained from the initial state of reticle R, through the calculation (Yc1−Yc2)/Lk. The position coordinate Yr in the Y direction of reticle R of the scanning exposure time can be obtained through the calculation (Yc1+Yc2)/2.

Based on this position coordinate Yr, linear motor units 200A and 200B are controlled with identical driving force, so that reticle stage RST is moved with a prescribed speed in the Y direction. Additionally, by creating a difference between the driving force of linear motor units 200A and 200B, so that the measured rotational variable amount Δθc becomes an invariably fixed value (i.e., zero), or, alternatively, becomes a value that varies according to a particular tendency, minute rotations may be made to reticle stage RST. In FIG. 12: AX is the optical axis of the projection optical system PL; and a rectangular area LE, extending in the X direction, with optical axis AX as its center, is an illumination area of illuminating light during the scanning exposure time.

In accordance with the preferred embodiments described above, reticle R, through the protrusion components of mounts 10B and 10D, which are in an almost diagonal position, is regulated in displacement along the Y axis, with the result being that the influence from the expansion of reticle R appears in FIG. 12 as minute rotations in the clockwise direction of reticle R. However, because in this preferred embodiment, corner mirrors CM1 and CM2 are formed at the end of reticle R, the collective rotational variations of reticle R, occurring from the expanded component of reticle R, and from the shifting component on mounts 10A–10D, can be accurately measured across a comparatively wide range.

Accordingly, when reticle R and wafer W are relatively moved in the Y direction at a speed ratio equal to the image formation magnification of the optical projection system, so that exposure scanning is performed of the image of the pattern area of reticle R, illuminated by illumination area LE on the shot area of wafer W, adjustments can be performed of the size (magnification) of the scanning direction of the entire image of the projected patterned area by finely adjusting the relative speed ratio (between the reticle stage and wafer stage) by an amount corresponding to the expansion amount of reticle R, with respect to the exact value of the image formation magnification.

The size adjustments concerning the non-scanned direction (X direction) of the entire image of the projected patterned area, as explained in FIG. 9 above, may be made by finely adjusting the image formation magnification of the projection optical system PL itself, in response to the expansion amount of reticle R. Moreover, the structure of this preferred embodiment can be applied to an exposure apparatus for manufacturing a large-sized liquid crystal device, in which the projection optical system has an image formation magnification of 1, and mask substrates and photosensitive substrates are maintained on a common carriage and are scanned one-dimensionally with respect to the projection optical system. Such apparatus include, e.g., a multi-lens style of projection exposure device disclosed in Japanese Laid-Open Patent Application No. 7-57986, the disclosure of which is incorporated herein by reference in its entirety.

In this preferred embodiment, a temperature sensor for measuring the expansion of reticle R, or interferometers for measuring reticle dimensions, are not particularly used for performing measurement of the expansion amount of reticle R; however, as necessary, a measuring system may be established to perform such measurement of the amount of expansion, either directly or indirectly, as in the previous embodiments.

The circuit pattern to be printed on the mask substrate and several alignment marks are precisely positioned on the mask substrate using side surfaces of the mask substrate as a reference. This facilitates the control of position references in the projection exposure apparatus, which uses the mask substrate to transfer the pattern image onto the photosensitive substrate. Because the mask stage supports the mask substrate so as to allow for free expansion, the mask substrate is prevented from being warped even if the mask substrate absorbs a portion of the illumination energy and expands. This can further prevent distortion or warp of the image plane, which adversely affects the quality of the projected pattern image during projection exposure. Furthermore, measuring devices are provided to measure positional displacement of the side surface of the mask substrate on the mask stage, and the mask substrate is moved based on the measuring results. Even if the mask substrate slightly slips out of the initial position on the mask stage, the mask substrate can be precisely positioned to the desired target position by correcting the displacement.

Expansion of the reticle R during the projection exposure is directly and accurately measured, whereby alignment error, superposing error, and magnification error in the projected image are corrected in real time.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A mask comprising:
   a main surface and side surfaces located at a periphery of the main surface;
   a pattern formed substantially parallel to the main surface of the mask; and
   at least one reflective area provided at least on a portion of the side surfaces of the mask, the pattern being aligned with the at least one reflective area.

2. The mask of claim 1, wherein the mask has a rectangular shape, and the at least one reflective area is formed on at least two orthogonal side surfaces of the mask.

3. The mask of claim 1, wherein the mask includes a transparent plate having the main surface, and the pattern is formed of a light-blocking material layer deposited on the main surface.

4. The mask of claim 1, wherein the mask includes a transparent plate having the main surface, and the pattern is formed of a phase-shifter material layer deposited on the main surface.

5. The mask of claim 1, wherein the at least one reflective area is a layer of reflective material deposited on the side surfaces of the mask.

6. The mask of claim 1, wherein a plurality of the reflective areas are provided at distinct, spaced apart locations on the side surfaces of the mask.

7. The mask of claim 6, wherein at least one of the plurality of reflective areas is partially light-transmissive.

8. The mask of claim 7, wherein a reflective area having a light-reflective surface that faces an internal portion of the mask is provided at a position on the mask that is diametrically opposed to the at least one partially light-transmissive reflective area.

9. The mask of claim 1, wherein the side surfaces of the mask include a notch, the at least one reflective area being provided in the notch.

10. The mask of claim 1, wherein the mask includes a right-angle corner, the at least one reflective area being provided on the side surfaces of the mask located at the right-angle corner.

11. The mask of claim 10, wherein the at least one reflective area provided on the side surfaces of the mask located at the right-angle corner includes a reflective surface that faces toward an internal portion of the mask.

12. The mask of claim 1, wherein the mask includes a cut-off corner, the at least one reflective area being provided on the side surfaces of the mask located at the cut-off corner.

13. The mask of claim 12, wherein the at least one reflective area provided on the side surfaces of the mask located at the cut-off corner is partially light-transmissive.

14. A projection exposure apparatus comprising:
    an illumination optical system located between a light source and a mask illuminated with light from the light source;
    a mask stage that mounts the mask to receive light from the light source;
    a substrate stage that mounts a substrate having a plurality of areas that are to receive light from the illuminated mask;
    a projection optical system located between the mask stage and the substrate stage; and
    a mask mounted to the mask stage, the mask including a pattern formed substantially parallel to a main surface of the mask and at least one reflective area provided at least on a portion of side surfaces of the mask, the side surfaces located at a periphery of the main surface, the pattern being aligned with the at least one reflective area.

15. A projection exposure apparatus comprising:
    an illumination optical system located between a light source and a mask illuminated with light from the light source, the mask having a pattern thereon;
    a projection optical system located between the mask and a substrate to project the pattern of the mask onto the substrate by the illumination from the light source;
    a two-dimensional driving stage that mounts the substrate and moves the substrate with respect to a field of view of the projection optical system;
    a mask stage having a plurality of mounts on which the mask is supported so that a main surface of the mask, along which the pattern extends, is aligned with an object plane of the projection optical system, the plurality of mounts contacting the mask at a plurality of positions along a periphery of the mask and allowing for movement of the mask on the mounts along the main surface;
    a column structure that integrally supports the mask stage and the projection optical system;
    a measurement system that emits a measuring beam to a reflective area formed on at least a portion of side surfaces of the mask and that receives a beam reflected from the reflective area to detect information about positional changes of the reflective area of the mask; and
    a driving mechanism that slightly moves the mask relative to the mask stage based on the information obtained by the measurement system.

16. The apparatus of claim 15, wherein the measurement system is an interferometer system.

17. The apparatus of claim 15, further comprising a temperature sensing system that detects temperature information of the mask, and wherein the driving mechanism also moves the mask stage relative to the column structure based on the temperature information obtained by the temperature sensing system.

18. The apparatus of claim 15, wherein the measurement system emits two of the beams and detects information about a positional change of reflective areas of the mask in two orthogonal directions.

19. The apparatus of claim 15, further comprising a projection optical system controller that controls a magnification amount by which the projection optical system magnifies the pattern of the mask projected onto the substrate.

20. A projection exposure apparatus comprising:
    a two-dimensional driving stage that mounts a substrate and moves the substrate; and
    a mask stage having a plurality of mounts on which a mask is supported, a main surface of the mask having a pattern to be exposed onto the substrate, the plurality of mounts contacting the mask at a plurality of positions along a periphery of the mask, and allowing for expansion of the mask on the mounts along the main surface without inducing stress in the mask.

21. The apparatus of claim 20, wherein the mask stage includes a pushing member that gently forces the mask supported on the plurality of mounts in a direction along the main surface, and the mask is maintained in position on the plurality of mounts only by gravity.

22. The apparatus of claim 20, further comprising at least one vacuum port that applies vacuum to at least one of the plurality of mounts to hold the mask on the mounts.

23. The apparatus of claim 22, wherein at least some of the plurality of mounts do not have the vacuum applied thereto so that the mask is free to slide thereon.

24. The apparatus of claim 20, further comprising a driving mechanism that moves the mask relative to the mask stage.

25. The apparatus of claim 20, further comprising a measurement system that obtains information regarding changes in position of the mask relative to the mask stage; and a driving mechanism that moves the mask relative to the mask stage based on the information obtained by the measurement system.

26. The apparatus of claim 25, wherein the measurement system emits a measuring beam to a reflective area formed on at least a portion of side surfaces of the mask and receives a beam reflected from the reflective area thereby detecting the information about changes in the position of the mask relative to the mask stage.

27. The apparatus of claim 26, wherein the measurement system is an interferometer system.

28. The apparatus of claim 25, wherein the measurement system includes a temperature sensing system that detects temperature information of the mask, and wherein the driving mechanism moves the mask relative to the mask stage based on the temperature information obtained by the temperature sensing system.

29. A positioning apparatus for positioning a substrate which has a main surface and side surfaces located at a periphery of the main surface of the substrate, comprising:

(a) a substrate bearing structure having at least a portion of a drive actuator that moves the substrate in a plane parallel to the main surface of the substrate;

(b) a measuring system that emits a measuring beam toward a reflective area provided on at least a portion of the side surfaces of the substrate, that detects a reflected beam from the reflective area of the substrate and that generates a positional information representing a coordinate value or a displacement amount of the substrate directly; and (c) a control system coupled between said measuring system and said drive actuator to energize said drive actuator in response to said positional information.

30. The positioning apparatus of claim 29, wherein said measuring system is an interferometric measuring system.

* * * * *